(12) United States Patent
Hattori et al.

(10) Patent No.: US 9,378,962 B2
(45) Date of Patent: Jun. 28, 2016

(54) NONVOLATILE SEMICONDUCTOR STORAGE DEVICE HAVING A CHARGE STORAGE LAYER THAT INCLUDES METAL GRAINS

(75) Inventors: Shigeki Hattori, Kanagawa-ken (JP); Masakazu Yamagiwa, Tokyo (JP); Masaya Terai, Kanagawa-ken (JP); Hideyuki Nishizawa, Tokyo (JP); Koji Asakawa, Kanagawa-ken (JP); Yoshiaki Fukuzumi, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 697 days.

(21) Appl. No.: 13/601,539

(22) Filed: Aug. 31, 2012

(65) Prior Publication Data
US 2013/0242670 A1    Sep. 19, 2013

(30) Foreign Application Priority Data
Mar. 19, 2012 (JP) ................. 2012-062004

(51) Int. Cl.
| | |
|---|---|
| G11C 16/04 | (2006.01) |
| H01L 21/28 | (2006.01) |
| B82Y 10/00 | (2011.01) |
| H01L 29/423 | (2006.01) |
| H01L 29/788 | (2006.01) |
| H01L 27/115 | (2006.01) |

(52) U.S. Cl.
CPC ........... *H01L 21/28273* (2013.01); *B82Y 10/00* (2013.01); *G11C 16/0416* (2013.01); *G11C 16/0483* (2013.01); *H01L 27/11556* (2013.01); *H01L 29/42332* (2013.01); *H01L 29/7881* (2013.01)

(58) Field of Classification Search
CPC .......... H01L 21/28273; H01L 27/11556; H01L 29/42332; H01L 29/7881; B82Y 10/00; G11C 16/0416; G11C 16/0483
See application file for complete search history.

(56) References Cited

U.S. PATENT DOCUMENTS

| | | | | |
|---|---|---|---|---|
| 6,031,760 | A * | 2/2000 | Sakui et al. | 365/185.21 |
| 8,829,594 | B2 * | 9/2014 | Tatsumura | H01L 29/66833 257/324 |
| 2005/0072989 | A1 * | 4/2005 | Bawendi | B82Y 10/00 257/200 |
| 2005/0122775 | A1 | 6/2005 | Koyanagi | |
| 2005/0287717 | A1 | 12/2005 | Heald | |
| 2006/0047825 | A1 | 3/2006 | Steenstra | |
| 2006/0110870 | A1 * | 5/2006 | Bhattacharyya | B82Y 10/00 438/197 |
| 2006/0261401 | A1 * | 11/2006 | Bhattacharyya | 257/316 |
| 2010/0105178 | A1 * | 4/2010 | Kim et al. | 438/261 |

(Continued)

FOREIGN PATENT DOCUMENTS

| | | |
|---|---|---|
| JP | H11-186421 | 7/1999 |
| JP | 2002-176166 | 6/2002 |

(Continued)

*Primary Examiner* — Khamdan Alrobaie
(74) *Attorney, Agent, or Firm* — Patterson & Sheridan, LLP

(57) ABSTRACT

A nonvolatile semiconductor storage device includes a semiconductor layer, a first insulating film formed on the semiconductor layer, a charge storage layer formed on the first insulating film and having fine metal grains, a second insulating film formed on the charge storage layer, and a gate electrode formed on the second insulating film. During a write operation, a differential voltage is applied across the gate electrode and the semiconductor layer to place the gate electrode at a lower voltage than the semiconductor layer and cause a positive electric charge to be stored in the charge storage layer.

18 Claims, 19 Drawing Sheets

(56) References Cited

U.S. PATENT DOCUMENTS

| | | | |
|---|---|---|---|
| 2010/0123222 A1* | 5/2010 | Ivanova-Hristova | B82Y 10/00 257/632 |
| 2010/0163108 A1 | 7/2010 | Bessho | |
| 2010/0170612 A1* | 7/2010 | Velegol et al. | 156/60 |
| 2012/0018792 A1 | 1/2012 | Matsushita | |
| 2012/0061746 A1 | 3/2012 | Ohba | |
| 2012/0235219 A1* | 9/2012 | Ohba | B82Y 10/00 257/314 |

FOREIGN PATENT DOCUMENTS

| | | |
|---|---|---|
| JP | 2002-222880 | 8/2002 |
| JP | 2003-168606 | 6/2003 |
| JP | 2005-116682 | 4/2005 |
| JP | 2005-0328029 | 11/2005 |
| JP | 2006-0120663 | 5/2006 |
| JP | 2007-036256 | 2/2007 |
| JP | 2011-035073 | 2/2011 |

* cited by examiner

WRITE DATA "1"

SEMICONDUCTOR LAYER   CHARGE STORAGE LAYER   GATE ELECTRODE

WRITE

WRITE DATA "1"

SEMICONDUCTOR LAYER    CHARGE STORAGE LAYER    GATE ELECTRODE

NONVOLATILE SEMICONDUCTOR STORAGE DEVICE HAVING A CHARGE STORAGE LAYER THAT INCLUDES METAL GRAINS

CROSS-REFERENCE TO RELATED APPLICATION

This application is based upon and claims the benefit of priority from Japanese Patent Application No. 2012-062004, filed Mar. 19, 2012; the entire contents of which are incorporated herein by reference.

FIELD

Embodiments described herein relate generally to a nonvolatile semiconductor storage device.

BACKGROUND

A nonvolatile semiconductor storage device has a charge storage part which stores data by storing charge for each memory cell of the device. However, for such a device having a charge storage part across multiple memory cells, as the structure becomes finer, the charge stored in the charge storage part moves between the memory cells, and a transistor on/off voltage threshold in the device varies as the data is read.

Here, a scheme is proposed to address this problem.

DETAILED DESCRIPTION

In general, one embodiment will be explained in detail.

Embodiments disclosed herein provide a nonvolatile semiconductor storage device with a wide memory window and a long data holding time.

The nonvolatile semiconductor storage device of the embodiment has a semiconductor layer, a first insulating film formed on the semiconductor layer, a charge storage layer formed on the first insulating film and having fine metal grains, e.g., nanodots, a second insulating film formed on the charge storage layer, and a gate electrode formed on the second insulating film; in the data write operation, a differential voltage is applied across the semiconductor layer and the gate electrode, and a positive electric charge is stored in the charge storage layer.

Embodiment 1

According to a first embodiment, the nonvolatile semiconductor storage device has a semiconductor layer, a first insulating film formed on the semiconductor layer, a charge storage layer formed on the first insulating film and having fine metal grains, a second insulating film formed on the charge storage layer, and a gate electrode formed on the second insulating film. During a data write operation, a differential voltage is applied across the semiconductor layer and the gate electrode, and a positive electric charge is stored in the charge storage layer by applying the relatively negative voltage on the gate electrode.

The nonvolatile semiconductor storage device in this embodiment has a constitution in which a positive electric charge (holes), is stored in the charge storage layer containing fine metal grains. With this constitution, due to the Coulomb blockade phenomenon and storage of the holes, there is suppression of injection of negative electric charge, i.e., electrons, to the charge storage layer. Consequently, the charge storage quantity increases and the charge holding time increases. Consequently, it is possible to realize a nonvolatile semiconductor storage device with a wide memory window and a long data holding time.

Figure 1:
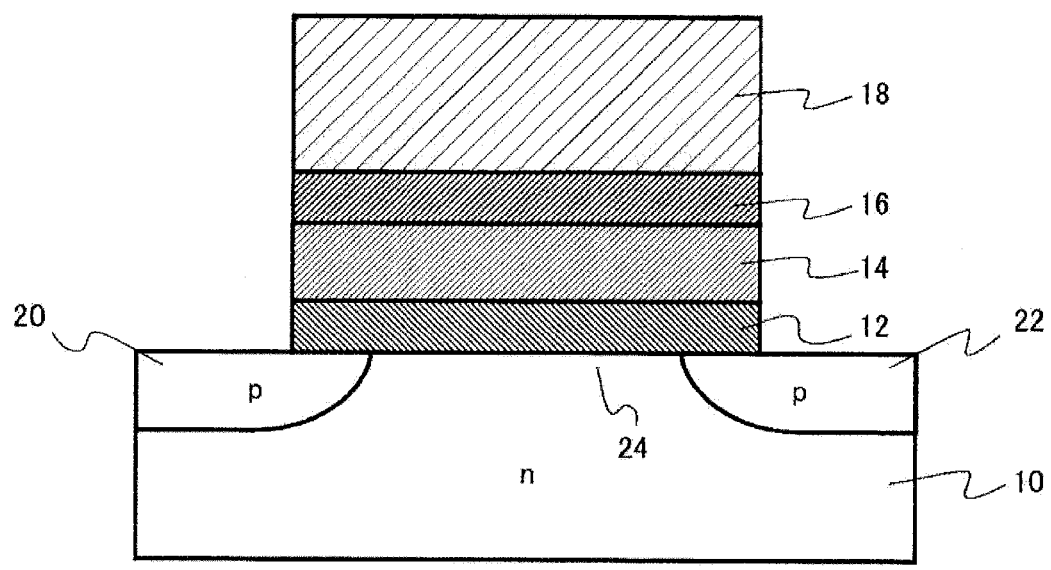
FIG. 1 is a cross-sectional view illustrating the memory cell portion of a nonvolatile semiconductor storage device according to a first embodiment.
Figure 2:
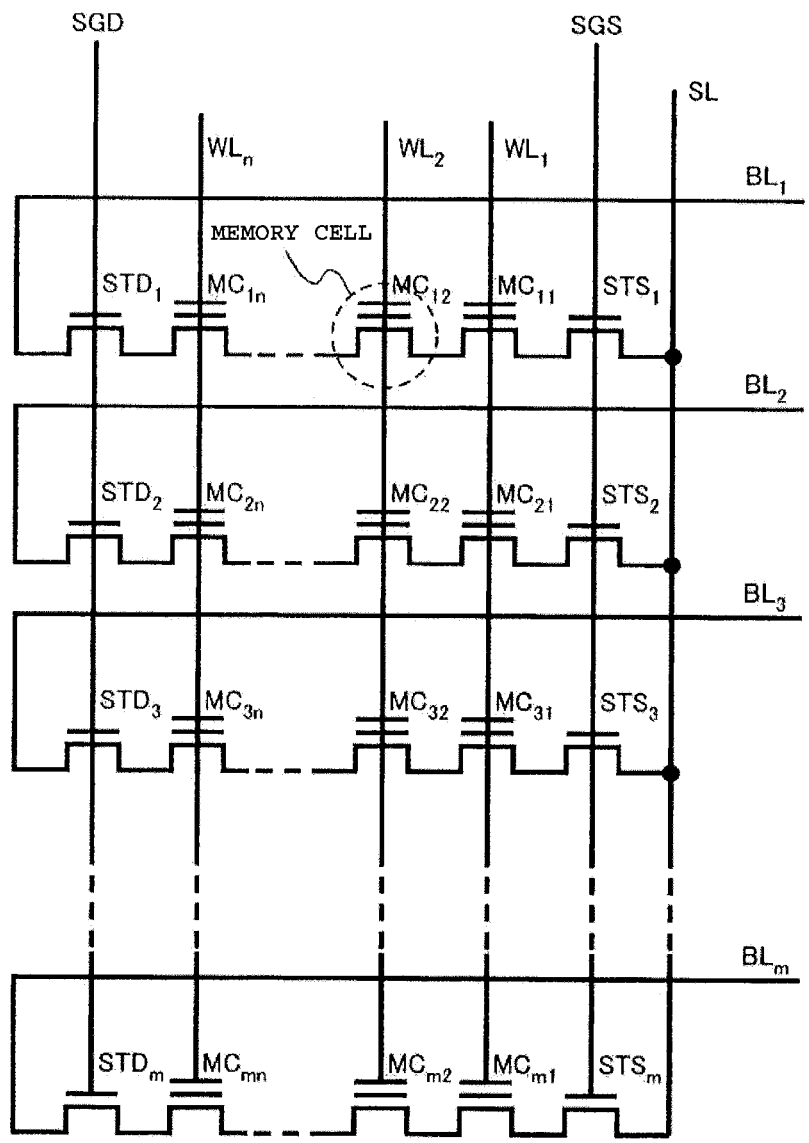
FIG. 2 is a circuit diagram of the memory cell array of the nonvolatile semiconductor storage device of the first embodiment.

FIG. 1 is a cross-sectional view illustrating the memory cell portion of the nonvolatile semiconductor storage device of the present embodiment. FIG. 2 is a circuit diagram illustrating the memory cell array of the nonvolatile semiconductor storage device of the present embodiment. The nonvolatile semiconductor storage device in this embodiment is a NAND type nonvolatile semiconductor storage device.

As shown in FIG. 2, for example, the memory cell array is formed from m×n (m and n are integers) floating gate structure transistors, i.e., memory cell transistors, $MC_{11}$~$MC_{1n}$, $MC_{21}$~$MC_{2n}$, ..., $MC_{m1}$~$MC_{mn}$. For the memory cell array, the memory cell transistors are arranged in the column direction and row direction, so that the multiple memory cell transistors are arranged in a matrix configuration.

In the memory cell array, for example, the $MC_{11}$~$MC_{1n}$ and the selecting gate transistors $STS_1$, $STD_1$ are connected in series and form a NAND string (memory string) as the cell unit.

The memory cell transistor $MC_{11}$ is located at the end of the configuration of a group of series connected memory cell transistors $MC_{11}$~$MC_{1n}$. Its source region is connected with the drain region of a selecting gate transistor $STS_1$ which selects the memory cell transistors $MC_{11}$~$MC_{1n}$. Also, the memory cell transistor $MC_{1n}$ is located at the end of a group of series connected memory cell transistors $MC_{11}$~$MC_{1n}$. Its drain region is connected with the source region of the selecting gate transistor $STD_1$ which is for selecting the memory cell transistors $MC_{11}$~$MC_{1n}$.

The selecting gate transistors $STS_2$~$STS_m$, the memory cell transistors $MC_{21}$~$MC_{2n}$, ... $MC_{m1}$~$MC_{mn}$, and the selecting gate transistors $STD_2$~$STD_m$ are connected in series in the same way, respectively, as the aforementioned three groups of transistors described in the last paragraph, The connected transistors form the NAND strings.

A common source line SL is connected with the sources of the selecting gate transistors $STS_1$~$STS_m$.

The memory cell transistors $MC_{11}$, $MC_{21}$, ... $MC_{m1}$, the memory cell transistors $MC_{12}$, $MC_{22}$, ..., $MC_{m2}$, ..., and the memory cell transistors $MC_{1n}$, $MC_{2n}$, ... $MC_{mn}$ are connected by the word lines $WL_1$~$WL_n$ that control the operation voltage applied on the transistors' gate electrodes.

Also, there is a common selecting gate line SGS connected to the selecting gate transistors $STS_1$~$STS_m$ and a common selecting gate line SGD connected to the selecting gate transistors $STD_1$~$STD_m$.

On the periphery of the memory cell array shown in FIG. 2, a peripheral circuit not shown in the figure is formed. This peripheral circuit is configured for a voltage to be applied where the channel region of the memory cell transistor is formed when the write operation of the data is executed. The applied voltage is applied so as to create a voltage drop from the semiconductor layer to the gate electrode of the memory cell transistor.

FIG. 1 is a cross-sectional view illustrating one memory cell in the memory cell array as shown in FIG. 2, such as the memory cell surrounded by a broken line in FIG. 2. In this embodiment, an explanation will be made on an example in which the memory cell transistor is a p-type transistor with holes as the carriers.

The memory cell is formed on, for example, an n-type semiconductor layer 10 containing an n-type impurity. Here, there is a tunnel insulating film 12 (first insulating film) on the n-type semiconductor layer 10, a charge storage layer 14 on the tunnel insulating film 12, a block insulating film 16 on the charge storage layer 14, and a gate electrode 18 on the block insulating film 16. In the semiconductor layer 10 on a first and second side of the gate electrode 18, a source region 20 and a drain region 22 are formed, respectively. The region beneath the gate electrode 18 in the semiconductor layer 10 is the channel region 24. Here, the channel region 24 is sandwiched between the source region 20 and the drain region 22.

The charge storage layer 14 has the function of actively storing the charge as the memory cell information. Here, in the case of write/erasure of the memory cell, the tunnel insulating film 12 (first insulating film) works as an electron/hole moving medium between the channel region 24 in the semiconductor layer 10 and the charge storage layer 14. Also, in the read/standby mode, due to the barrier height, the tunnel insulating film 12 serves the function of suppressing the electron/hole movement between the channel region 24 and the charge storage layer 14. Here, the block insulating film 16 (second insulating film) is the so-called inter-electrode insulating film, and it has the function of blocking the electron/hole flow between the charge storage layer 14 and gate electrode 18.

The tunnel insulating film 12 is, for example, a silicon oxide ($SiO_2$) film. The charge storage layer 14 is a mono-grain layer composed of fine metal grains of, for example, gold (Au). Here, the mono-grain layer refers to the state in which there is only one grain layer.

For example, the block insulating film 16 is made of hafnium oxide. For example, the gate electrode 18 is made of polysilicon with electroconductivity realized by doping an impurity in the polysilicon. Also, the source region 20 and the drain region 22 may be p-type diffusion layers containing a p-type impurity.

The electroconductive fine metal grains that form the mono-grain layer are bonded by an organic substance that displays a chemical bonding property with the tunnel insulating film 12 or block insulating film 16. Also, the fine metal grains may have their surfaces coated with an organic substance that displays a weak chemical bonding property between molecules, and a weak chemical bond is generated between the adjacent grains. Due to this weak chemical bond, multiple grains are incorporated into the mono-grain layer, and the mono-grain layer therefore has a high density.

Figure 3:
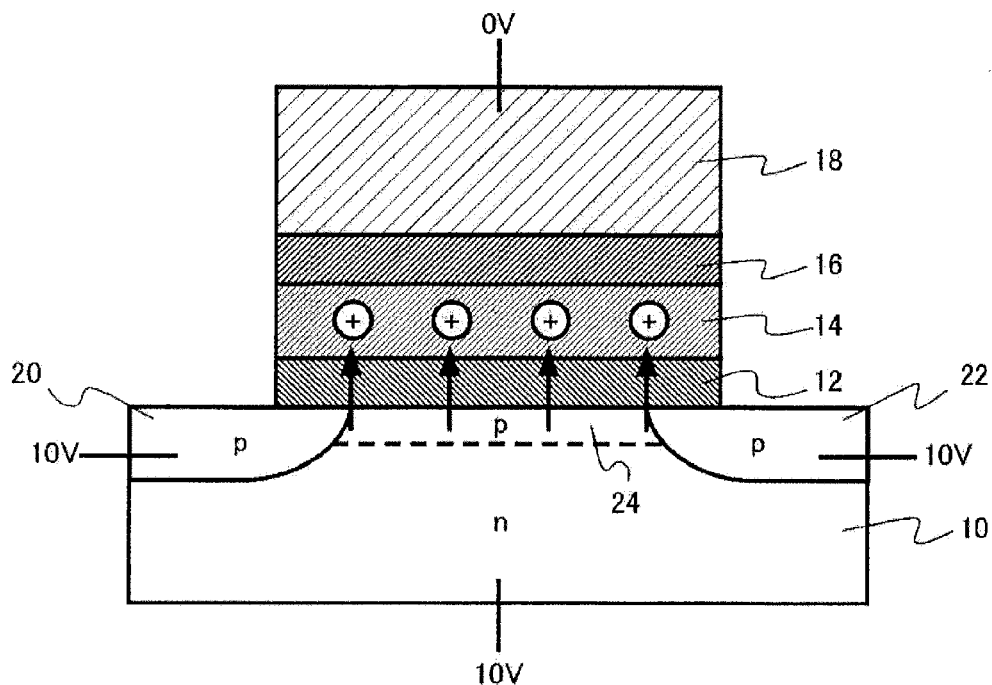
FIG. 3 is a diagram illustrating the write operation of the memory cell in the first embodiment.

In the following, an example of the write, erasure, and read operations of the memory cell will be explained. FIG. 3 is a diagram illustrating the write operation of the memory cell in this embodiment.

In the write operation of the memory cell, a voltage is applied so as to create a voltage drop from the semiconductor layer 10 to the gate electrode 18, and a positive electric charge is stored in the charge storage layer 14. As shown in FIG. 3, for example, the gate electrode 18 is grounded, while a voltage of 10 V is applied on the semiconductor layer 10. Then, for example, a voltage of 10 V is applied on the source region 20 and the drain region 22.

Holes of an inversion layer are stored in the channel region 24. The holes move into the tunnel insulating film 12, and are stored in the mono-grain layer of the charge storage layer 14.

Figure 4:
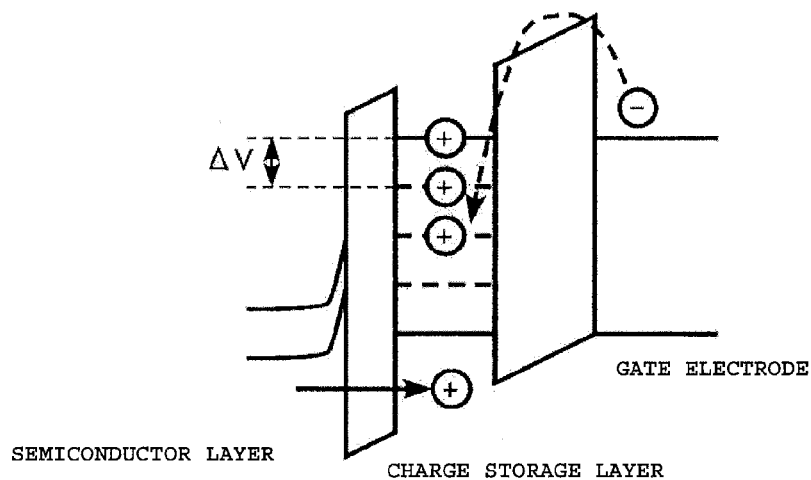
FIG. 4 is a band diagram illustrating the write operation in the first embodiment.

FIG. 4 is a band diagram illustrating the write operation in this embodiment. A negative voltage is applied at the gate electrode 18 to store data. During the negative voltage application, holes are stored in the nanodots, and two processes occur simultaneously.

In the first process, holes are injected from the channel region 24 through the tunnel insulating film 12, and are trapped by the nanodots. In the second process, electrons move from the gate electrode 18, on the opposite side of the charge storage layer, through the block insulating film 16, and are trapped by the nanodots. The electrons cancel the stored holes. Since the number of the electrons is lower than the number of the holes, holes are stored in the nanodots.

During the write operation, the Coulomb blockade phenomenon takes place by the nanodots. When one hole is stored in one nanodot, the potential of the nanodot falls by $\Delta V$, and, as additional holes are subsequently stored in the nanodot, the potential decreases further. Here, a decrease in the potential means that the potential increases on the positive (silicon/channel region) side. The lower the potential of the nanodots in the charge storage layer 14, the deeper the apparent work function is.

The more the nanodots store holes, the easier it is for the nanodots to store additional holes. This phenomenon occurs because of the Coulomb blockade phenomenon. That is, charge trapping enhances rather than saturates in this embodiment. This is one of the characteristics of this embodiment, and is unlike the conventional flash memory which shows trapping saturation in a write operation.

As the write operation advances, there is a slight decrease in the number of holes injected from the channel region 24 and trapped by the nanodots, due to the deep apparent work function of the nanodots. On the other hand, the number of the electrons that come from the gate electrode 18 and cancel the stored holes significantly decreases. The decrease of the hole-canceling electrons is larger as compared with the decrease of the injection holes. That is, the number of the stored holes in the nanodots increases as the write operation advances.

Even in the state when the voltage difference between the gate electrode 18 and the semiconductor layer 10 returns to 0 V, the storage state of the holes is maintained. In this state, the threshold voltage of the memory cell transistor is higher than that when no hole is stored. In such a state, it becomes more difficult to turn on the transistor. This is the state when data "0" is written.

As the number of holes stored in the nanodots due to the Couloumb blockade phenomenon increases, there may be an increase in the difference in the threshold voltage of a memory cell transistor from the threshold voltage when there are not stored holes. Consequently, the memory window can become wider. By using the wide memory window, it is possible to manufacture the multi-value memory easily.

Figure 5:
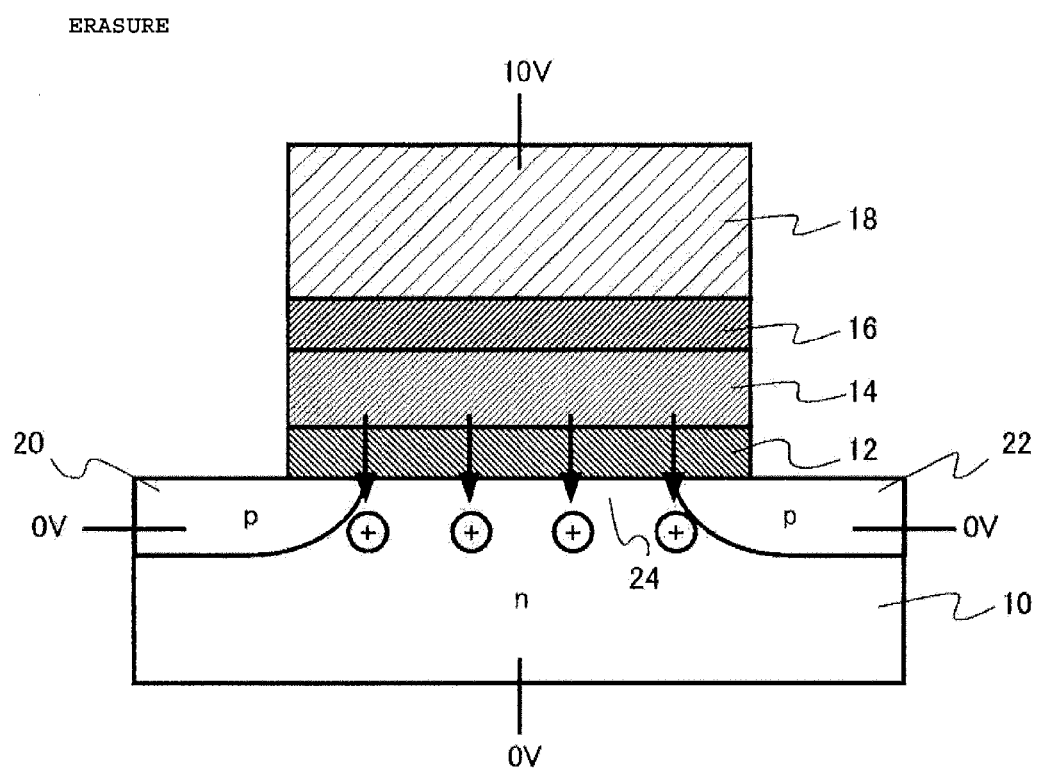
FIG. 5 is a diagram illustrating the erasure operation of the memory cell the first embodiment.

FIG. 5 is a diagram illustrating the erasure operation of the memory cell in this embodiment. Here, in the erasure operation of data, a voltage that ensures a relative positive voltage at the gate electrode 18 is applied between the gate electrode 18 and the semiconductor layer 10. As shown in FIG. 5, for example, a voltage of 10V is applied on the gate electrode 18, while the semiconductor layer 10 is attached to ground. Additionally, for example, the source region 20 and the drain region 22 may be grounded.

Due to a resulting electric field between the gate electrode 18 and the semiconductor layer 10, the holes stored in the charge storage layer 14 move in the tunnel insulating film 12, and are extracted to the semiconductor layer 10.

In the state in which the voltage difference from the gate electrode 18 to the semiconductor layer 10 is reset to 0 V, the stored electric charge is eliminated. Consequently, the threshold of the memory cell transistor becomes lower than the threshold when data "0" is written. That is, the memory cell transistor is now easy to turn on. This is the state associated with writing data "1".

Figure 6A:
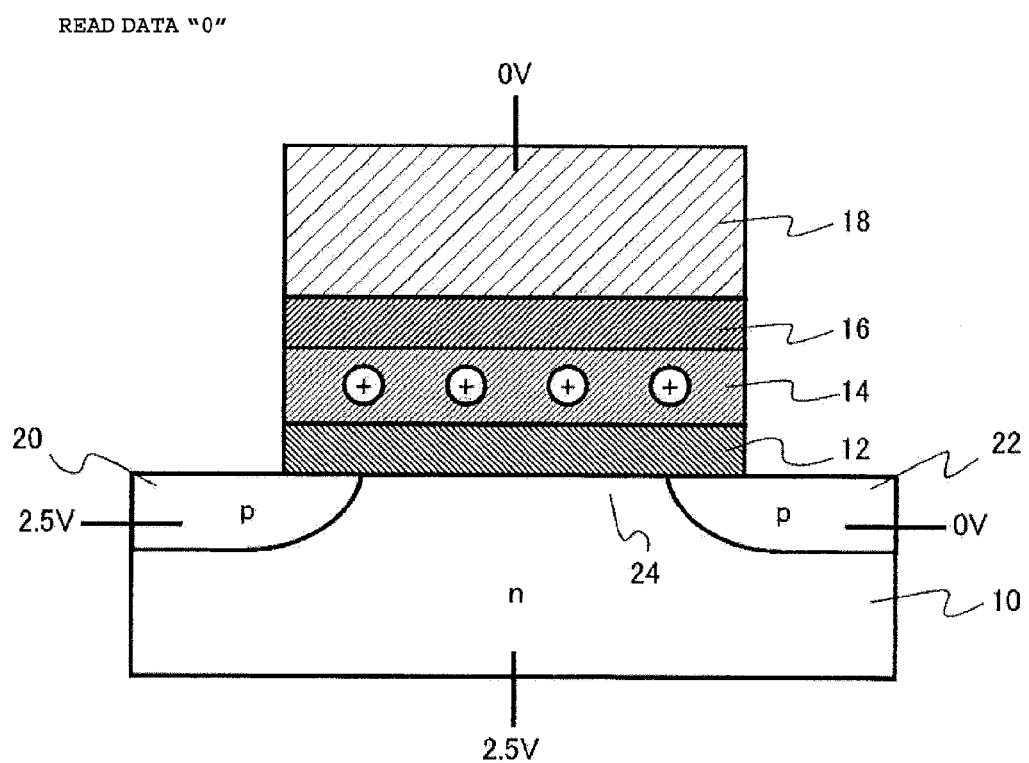
FIGS. 6A and 6B are diagrams illustrating the read operation of the memory cell the first embodiment.
Figure 6B:
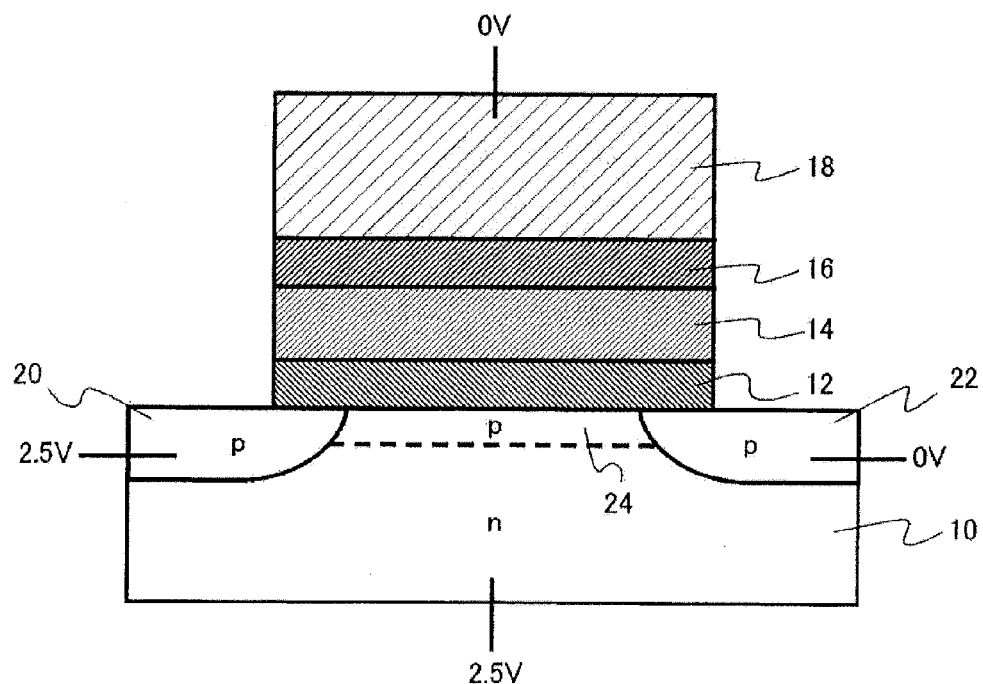

FIGS. 6A and 6B are diagrams illustrating the read operation of the memory cell in this embodiment. FIG. 6A shows the read operation of data "0", and FIG. 6B shows the read operation of data "1". When the data is read, a voltage differential is applied across the source region 20 and the drain region 22.

As shown in FIGS. 6A and 6B, for example, there is no voltage difference from the gate electrode 18 to the semiconductor layer 10. For example, a voltage of 2.5 V is applied on the source region 20, and a voltage of 0 V is applied on the drain region 22. For example, as shown in FIG. 6A, when it is in the state of data "0" with holes stored, the threshold of the transistor is high. Consequently, no inversion layer is formed in the channel region 24, and no current flows between the source and the drain.

On the other hand, in the erasure state, that is, in the state of data "1" without the storage of charge, the threshold of the transistor is low, so that an inversion layer is formed in the channel region 24, and a current flows between the source and the drain. Consequently, by detecting the current quantity of the transistor, it is possible to read whether the data is "0" or "1".

Also, after the write operation of the data, in the verify operation of the data for checking whether the write operation has been carried out sufficiently, the same operation as the read operation is executed. When a voltage is applied between the source region 20 and the drain region 22, and the desired current does not flow, a data write operation is carried out again.

As explained above, for the nonvolatile semiconductor storage device of the present embodiment, write, erasure, and read operations are carried out, and the nonvolatile semiconductor storage device works.

Figure 7:
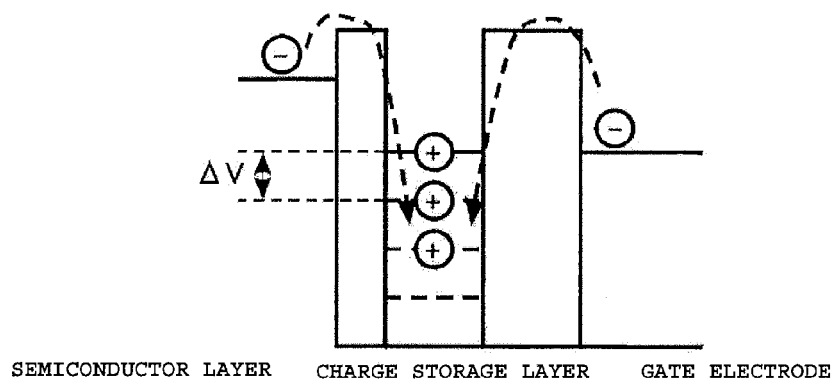
FIG. 7 is a band diagram illustrating the charge storage state of the memory cell the first embodiment.

FIG. 7 is a band diagram illustrating the charge storage state of the memory cell in this embodiment. In this state, there is no applied voltage differential across the gate electrode 18 and the semiconductor layer 10.

As explained above, when the holes are stored in the fine metal grains in the charge storage layer 14, the potential at the fine metal grains falls (becomes larger on the plus side). As a result, when no voltage is applied on the gate electrode 18, there is a decrease in the quantity of electrons extracted from the channel region 24 and moved through the tunnel insulating film 12 to the grain layer of the fine metal grains. Also, there is a decrease in the quantity of electrons that are extracted from the gate electrode 18 through the block insulating film 16 to the grain layer of the fine metal grains.

As the stored holes recombine with the electrons, they cancel each other. However, if the quantity of electrons trapped in the fine metal grains decreases, it becomes difficult to cancel the holes stored in the fine metal grains. As a result, the holes stored can be held for a long time. Consequently, the data holding time becomes longer.

The tunnel insulating film 12 may be either a monolayer film or a multilayer film. The material for the tunnel insulating film 12 is not limited to the silicon oxide presented as an example, and other types of insulating films can be adopted appropriately.

For the tunnel insulating film 12, the specific dielectric constant is preferably 4.0 or smaller. In cases for which the specific dielectric constant is 4.0 or smaller, the holding time for the charge stored in the fine metal grains increases.

The film thickness of the tunnel insulating film 12 is preferably in the range of 1 nm to 10 nm, or more preferably in the range of 5 nm to 7 nm. When the film thickness is thinner than 5 nm, a direct charge tunneling phenomenon occurs between the semiconductor layer 10 and the fine metal grains, and the holding time of the charge stored in the fine metal grains may decrease. Also, when the film thickness of the tunnel insulating film is thicker than 7 nm, the phenomenon of a fall in the potential at the fine metal grains generated due to storage of the charge on the fine metal grains becomes less significant, and the holding time of the charge stored on the fine metal grains becomes shorter.

When the tunnel insulating film 12 is made of silicon oxide, for example, a silicon substrate is loaded in a thermal oxidation oven to be oxidized forcibly in order to form the tunnel insulating film. Also, the tunnel insulating film may be formed using an Atomic Layer Deposition (ALD) or sputtering film forming device. When a film is formed, it is preferred that the formed insulating film be annealed by a Rapid Thermal Annealing (RTA) device.

In addition to the hafnium oxide ($HfO_2$), the block insulating film 16 may also be made of, for example, aluminum oxide ($Al_2O_3$). The block insulating film 16 may be a monolayer film or a laminated film. It is preferred that the specific dielectric constant be 10 or larger.

When the specific dielectric constant is 10 or larger, the charge holding time for the charge stored in the fine metal grains increases. The film thickness of the block insulating film 16 is preferably in the range of 5 nm to 20 nm, or more preferably in the range of 5 nm to 10 nm.

When the film thickness of the block insulating film 16 is thinner than this range, there may be the occurrence of the phenomenon of a fall in the potential of the fine metal grains as the charge is stored in the fine metal grains. When a negative voltage is applied on the gate electrode 18 and charge is stored in the mono-grain layer of the fine metal grains, as the charge moves in the block insulating film between the gate electrode 18 and the fine metal grains, the charge stored in the mono-grain layer of the fine metal grains moves in the block insulating film and the charge stored in the mono-grain layer is cancelled by the charge moving in the block insulating film, so that the charge may be erased. Also, when the charge stored in the mono-grain layer of the fine metal grains is held without applying a voltage on the gate electrode 18, the charge tends to move in the block insulating film between the side of the gate electrode 18 and the fine metal grains, as a result of which the charge stored in the mono-grain layer of the fine metal grains is cancelled by the charge moving in the block insulating film, and the charge may be erased.

Also, when the film thickness of the block insulating film 16 becomes thicker than 10 nm, the overall film thickness of the nonvolatile semiconductor storage device becomes thicker, and this might hamper the formation of a finer structure.

The block insulating film 16 can be formed using an Atomic Layer Deposition (ALD), sputtering, or other film forming device. When the base material has a mono-grain layer of the fine metal grains coated with an organic substance, the film forming device is preferably a low-damage film forming device free of decomposition of the organic substance that covers the fine metal grains. For example, a thermal type ALD device is preferred. As the insulating film after film formation, it is preferred that annealing be carried out using a Rapid Thermal Annealing (RTA) device, as the atom density in the film rises.

Any electroconductive material may be used for the gate electrode 18. In addition to the polysilicon, the gate electrode 18 may also be made of amorphous silicon, etc., with electroconductivity being obtained through the doping of an impurity. Also, the gate electrode 18 may be made of metals, alloys, etc.

For example, the charge storage layer 14 is a grain layer of multiple fine metal grains having charge storage ability. Examples of the fine metal grains include, in addition to gold (Au), silver (Ag), copper (Cu), platinum (Pt), palladium (Pd), tungsten (W), ruthenium (Ru), cobalt (Co), and nickel (Ni) fine grains. Also, different types of fine metal grains may be mixed for use.

In order to have an even wider memory window and to have an even longer data holding time, the use of fine metal grains with an even smaller size is preferred. Also, it is preferred that the work function of the metal of the fine metal grains be larger.

Here, the grain size of the fine metal grains in this specification refers to the mean grain size of the fine metal grains in the charge storage layer 14. For example, using a TEM (transmission electron microscope), the mean value of the maximum size and the minimum size of each grain is defined as the grain size of the grain; the mean value is then calculated for multiple grains to define the grain size of the metal grains in the charge storage layer 14.

When one hole is stored in one fine metal grain, the potential of the fine metal grain falls by $\Delta V$ as shown in FIG. 4 and, as the second, the third, and other holes are subsequently stored in the fine metal grain, the potential keeps decreasing. Here, the magnitude $\Delta V$ of decrease in the potential depends on the value obtained by dividing the charge quantity by the capacitance between the fine metal grains and the semiconductor layer 10.

The capacitance value between the fine metal grains and the semiconductor layer 10 strongly depends on the capacitance value of the fine metal grains themselves. The capacitance value of the fine metal grains themselves is represented by the value obtained by multiplying the dielectric constant of the surface materials on fine metal grains by the surface area of the fine metal grains. Consequently, the capacitance between the fine metal grains and the semiconductor layer 10 is a value that is proportional to the grain size of the fine metal grains. The smaller the capacitance of the fine metal grains, the larger the decrease in potential $\Delta V$ which occurs for each added hole stored in the fine metal grain.

The lower the potential of the fine metal grains in the charge storage layer 14, the deeper the apparent work function. In addition, the larger the work function of the metal using in forming the fine metal grains, the deeper the apparent work function.

Consequently, by making the grain size of the fine metal grains smaller, the apparent work function is made larger, so that the memory window can be wider and the data holding time can be longer.

In order to have an even wider memory window and an even longer data holding time, the grain size of the fine metal grains should be 3.0 nm or smaller, or preferably 2.0 nm or smaller. When the grain size of the fine metal grains is smaller than 3.0 nm, or, in an even better configuration, smaller than 2.0 nm, the Coulomb blockade phenomenon can be significantly displayed.

In addition, in order to ensure stable manufacturing, it is preferred that the grain size of the fine metal grains be 0.5 nm or larger.

In addition, in order to have an even wider memory window and an even longer data holding time, the work function of the metal of the fine metal grains is preferably 4.0 or larger.

For example, the following operation is carried out. On a p-type doped Si substrate, which has an aluminum electrode with a film of 200 nm vapor deposited on its back surface, gold nano grains with a grain size of 3 nm are applied to form a mono-grain layer on a $SiO_2$ tunnel insulating film with a film thickness of 5 nm. Then, a block insulating film of $HfO_2$ with a film thickness of 10 nm is laminated. On the laminated film, a gold film with a film thickness of 100 nm is vapor deposited as the gate electrode. A negative voltage associated with the write operation is then applied on the gate electrode of the sample to measure the capacitance and to measure the stored electric charge quantity and the holding time of the stored electric charge.

When 3-nm gold nano grains are used, the stored electric charge quantity is about $2 \times 10^{13}$ cm$^{-2}$. In the measurement of the holding time, it is found that the stored electric charge quantity decays at a rate of about 5% per year. However, when the same experiment is executed for the gold nano grains with a grain size of 2 nm instead of the gold nano grains with a grain size of 3 nm, it is found that the stored electric charge quantity is about $3 \times 10^{13}$ cm$^{-2}$, and the results of the measurement of the holding time indicate that there is little decay of the stored electric charge quantity over approximately a 10 year period.

Compared with the case in which the grain size of the gold nano grains as the fine metal grains is 2 nm, when the grain size is 3 nm for the gold nano grains, the capacitance is about 1.5 times the capacitance of the former, and the potential decreases by about ⅓ as the holes are stored in the fine metal grains (the potential increases to the plus side). As a result, it is believed that the stored electric charge quantity and the holding time of the stored electric charge both decrease.

In addition, in order to facilitate manufacturing, it is preferred that the fine metal grains be coated with an organic substance. Also, due to the following reasoning related to the charge storage ability, there is further reason to prefer that the fine metal grains be coated with an organic substance.

For the fine metal grains, due to the potential decrease phenomenon (rise on the plus side), a large stored electric charge quantity and a long charge holding time can be realized. The magnitude of the decrease in potential depends on the value obtained by dividing the charge quantity by the capacitance between the fine metal grains and the semiconductor substrate. This capacitance strongly depends on the capacitance of the fine metal grains themselves, and it can be represented by the value obtained by multiplying the dielectric constant by the surface area of the fine metal grains.

Consequently, the capacitance depends not only on the grain size of the fine metal grains, but also significantly on the dielectric constant. In order to realize a large decrease in the potential, a small capacitance is needed. For this purpose, a smaller dielectric constant is also desired. Here, the dielectric constant refers to the dielectric constant between the fine metal grains and the semiconductor substrate, and it may depend on the substance surrounding the fine metal grains.

Here, the dielectric constant mentioned previously is also related to the dielectric constant of the insulating film. It is assumed that an inorganic oxide is used for the insulating film. As far as the inorganic oxide is concerned, silicon oxide ($SiO_2$) may be used since it has a high electrical resistivity and a small dielectric constant. In addition, by arranging an organic substance on the periphery of the fine metal grains, it is possible to further decrease the dielectric constant.

Usually, the organic substances have smaller dielectric constants than the inorganic oxides. For example, when gold nano grains are used as the fine metal grains, it is preferred that a decane thiol or other alkane thiols be used. Here, the specific dielectric constants of the alkane thiols are about 2.6.

In order to form the charge storage layer 14 as a grain layer of the fine metal grains between the tunnel insulating film 12 and the block insulating film 16 at a high density, it is preferred that the charge storage layer be formed by means of the chemical bonding property of the organic substance. For the fine metal grains with a smaller grain size, the fine metal grains tend to merge with each other, and it is unstable so that it is hard to maintain the structure. In order to solve the problem related to the stability of the structure, it is believed that forming an organic substance coating the periphery of the fine metal grains is an effective solution. However, it is hard to form the fine metal grains coated with an organic substance by vapor deposition or sputtering on the semiconductor substrate.

Here, the following scheme is considered: the fine metal grains coated with an organic substance are dispersed in an organic solvent, and the semiconductor substrate is then brought in contact with the solution. However, when the substrate is coated on the portion where the fine metal grains are to be formed, the fine metal grains are attached randomly at the portion to be formed, and a multi-layer structure of the fine metal grains is formed. As the multilayer structure of fine metal grains is randomly formed on the tunnel insulating film, in some cases, because the number of fine metal grains is different, it is hard to control the stored electric charge quantity by the negative voltage applied on the gate electrode.

In addition, as the multilayer fine metal grains are formed on the tunnel insulating film, followed by laminating the block insulating film 16 and gate electrode 18 on it to form a nonvolatile semiconductor storage device, the film thickness of the storage device becomes larger. Consequently, it hampers the effect in forming a finer structure, and the bit cost scaling may become impossible.

Here, it is preferred that the fine metal grains coated with the coating organic substance be introduced onto the tunnel insulating film by means of the chemical bonding property by using an organic substance (hereinafter to be referred to as organic substance having a chemical bonding property) that displays chemical reactivity to the insulating film and also displays chemical reactivity (different from that with the insulating film) with the fine metal grains coated with the organic substance (hereinafter to be referred to as coating organic substance). That is, it is preferred that the fine metal grains coated with the coating organic substance be anchored by using the self-assembled molecular monolayer (SAM) of the organic substance having a chemical reactivity.

Examples of the organic substances having a chemical bonding property and displaying chemical reactivity with the insulating film as well as chemical reactivity (different from that with the insulating film) with the fine metal grains coated with the coating organic substance include the hydrocarbon compounds having a thiol group (—SH group) at one end and having a silanol group (—$Si(OH)_3$, —$Si(OR)_3$) on the other end. Specific examples are listed below: trimethoxy silyl propyl thiol, triethoxy silyl propyl thiol, trimethoxy silyl butyl thiol, triethoxy silyl butyl thiol, trimethoxy silyl pentyl thiol, triethoxy silyl pentyl thiol, trimethoxy silyl hexyl thiol, triethoxy silyl hexyl thiol, trimethoxy silyl heptyl thiol, triethoxy silyl heptyl thiol, trimethoxy silyl octyl thiol, triethoxy silyl octyl thiol, trimethoxy silyl nonyl thiol, triethoxy silyl nonyl thiol, trimethoxy silyl decyl thiol, triethoxy silyl decyl thiol, trimethoxy silyl undecyl thiol, triethoxy silyl undecyl thiol, trimethoxy silyl dodecyl thiol, triethoxy silyl dodecyl thiol, trimethoxy silyl tridecyl thiol, triethoxy silyl tridecyl thiol, trimethoxy silyl tetradecyl thiol, triethoxy silyl tetradecyl thiol, trimethoxy silyl pentadecyl thiol, triethoxy silyl pentadecyl thiol, trimethoxy silyl hexadecyl thiol, triethoxy silyl hexadecyl thiol, trimethoxy silyl heptadcyl thiol, triethoxy silyl heptadecyl thiol, trimethoxy silyl octadecyl thiol, triethoxy silyl octadecyl thiol, trimethoxy silyl nonadecyl thiol, triethoxy silyl nonadecyl thiol, trimethoxy silyl icocyl thiol, triethoxy silyl icocyl thiol, etc.

It is preferred that the fine metal grains be anchored between the tunnel insulating film 12 and the block insulating film 16 by the self-assembled molecular monolayer made of molecules that have chemical groups, such as a chlorosylyl group, silanyl group, etc., which can bind with Si or other semiconductor as well as $SiO_2$, $WO_3$, $TiO_2$, $Al_2O_3$, $HfO_2$ or another metal oxide, and which contain thiol groups that can bind with the fine metal grains of Au, Ag, Cu, Pt, etc.

Also, it is preferred that the fine metal grains be anchored between the tunnel insulating film 12 and the block insulating film 16 by means of the self-assembled molecular monolayer represented by the following formula.

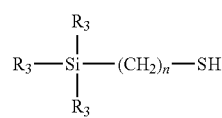

(Structure 1)

(where $R_3$ represents $OCH_3$, $OC_2H_5$, $OC_3H_5$, Cl, Br, F. The two examples of $R_3$ may be either to the same or different from one another, and n represents integer in the range of 1-20).

The coating organic substance, such as the alkane thiols, etc., coated on the periphery of the fine metal grains can strongly anchor the adjacent fine metal grains with each other as a result of its weak interaction between the organic molecules themselves, so that it can improve the coating rate of the fine metal grains on the tunnel insulating film. It is believed that the weak interaction between the organic molecules that coat the periphery of the fine metal grains is due to the van der Waals force and hydrogen bonds, etc., between the molecules.

The van der Waals force between the molecules increases as the molecular chain becomes longer and the number of contact points between the molecular chains increases. For example, the following types of organic substances may be used: octane thiol, nonane thiol, decane thiol, undecane thiol, dodecane thiol, tridecane thiol, tetradecane thiol, pentadecane thiol, hexadecane thiol, heptadecane thiol, octadecane thiol, nonadecane thiol, eicosane thiol, etc. In consideration of the contact points, the alkane thiols a with carbon chain of 10 or longer are preferred.

It is preferred that the fine metal grains be coated with the alkane thiol having the following structure.

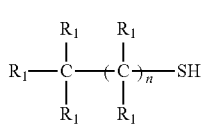

(Structure)

(where $R_1$ represents H, OH, Cl, Br, F, CN, $NH_2$, or COOH. The four examples of $R_1$ may be identical or different from each other, and n is an integer in the range of 10-20).

Also, the hydrogen bonds between molecules can be improved by introducing hydroxy groups (—OH), amino groups (—$NH_2$), carboxy groups (—COOH), carbonyl groups (>C=O), and other polar groups into the molecular structure. Examples of such groups include hydroxy octane thiol, hydroxy nonane thiol, hydroxy decane thiol, hydroxy undecane thiol, hydroxy dodecane thiol, hydroxy tridecane thiol, hydroxy tetradecane thiol, hydroxy pentadecane thiol, hydroxy hexadecane thiol, hydroxy heptadecane thiol, hydroxy octadecane thiol, hydroxy nonadecane thiol, hydroxy eicosane thiol, amino octane thiol, amino nonane thiol, amino decane thiol, amino undecane thiol, amino dodecane thiol, tridecane thiol, amino tetradecane thiol, amino pentadecane thiol, amino hexadecane thiol, amino heptadecane thiol, amino octadecane thiol, amino nonadecane thiol, amino eicosane thiol, carboxy octane thiol, carboxy nonane thiol, carboxy decane thiol, carboxy undecane thiol, carboxy dodecane thiol, carboxy tridecane thiol, carboxy tetradecane thiol, carboxy pentadecane thiol, carboxy hexadecane thiol, carboxy heptadecane thiol, carboxy octadecane thiol, carboxy nonandecane thiol, carboxy eicosane thiol, mercapto octanone, mercapto nonanone, mercapto decanone, mercapto undecanone, mercapto dodecanone, mercapto tridecanone, mercapto tetradecanone, mercapto pentadecanone, mercapto hexadecanone, mercapto heptadecanone, mercapto octadecanone, mercapto nonadecanone, mercapto icosanone, etc.

In addition, compounds having two or more types of polar groups for hydrogen bonding in the same molecular structure may be used, such as molecules having hydroxy groups (—OH) and amino groups (—$NH_2$). Examples of such compounds include amino hydroxy octane thiol, amino hydroxy nonane thiol, amino hydroxy decane thiol, amino hydroxy undecane thiol, amino hydroxy dodecane thiol, amino hydroxy tridecane thiol, amino hydroxy tetracane thiol, amino hydroxy pentadecane thiol, amino hydroxy hexadecane thiol, amino hydroxy heptadecane thiol, amino hydroxy octadecane thiol, amino hydroxy nonadecane thiol, amino hydroxy eicosane thiol, etc.

In this case, it is preferred that the fine metal grains be coated with the alkane thiol having the following structure.

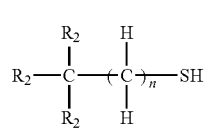

(Structure 3)

(where R2 represents OH, NH2, or COOH. The three examples of R2 may be identical to or different from each other, and n is an integer in the range of 10-20).

When the fine metal grains are introduced, for example, the following method may be adopted.

The surface of the insulating film which serves as the base for introducing the fine metal grains, such as the surface of the tunnel insulating film 12, is cleaned. The cleaning operation may be carried out, for example, by washing using a liquid mixture of sulfuric acid and aqueous hydrogen peroxide (with a mixing ratio of, for example, 2:1), or by UV cleaning with UV light irradiated on the surface of the insulating film.

The cleaned surface is then dipped in a solution prepared by dissolving the organic substance with a chemical bonding property in a solvent, so that the ends, such as silanol groups or the like, which have a chemical bonding property, react with the surface of the insulating film. The solvent should be a solvent capable of thoroughly dissolving the organic substance having a chemical bonding property. Examples of such solvents are acetone, toluene, ethanol, methanol, hexane, cyclohexane, isopropyl alcohol, and other organic solvents. In some cases, the organic substance having a chemical bonding property may be water soluble. In such a case, water may be used as the solvent.

As far as the concentration of the organic substance having a chemical bonding property dissolved in the solvent is concerned, if it is too weak, the reaction time becomes too long. On the other hand, if it is too strong, the quantity of the excessively adsorbed molecules that should be retransferred in the rinse operation increases. Consequently, the concentration should be established in a manner that balances these concerns. For example, it is preferred that the concentration of the organic substance be in the range of 1 mM~100 mM.

In order to improve the reactivity between the cleaned surface of the insulating film and the organic substance, a catalyst may be added. Examples of the catalysts which may be used for this purpose include the following types that can be dissolved in the solvent: acetic acid, formic acid, propionic acid, trifluoroacetic acid, triethylamine, ammonia, etc.

As far as the quantity of the catalyst added is concerned, if the quantity is too high, the organic substance having a chemical bonding property may undergo a self-reaction in the solvent to polymerize, or it may undergo other side reactions. Consequently, it is preferred that the quantity be small. More specifically, the volumetric quantity of the catalyst should be less than or equal to 3% of the volume of the solution. The time for dipping the surface of the insulating film in the solution of the organic substance should be appropriate for a sufficient reaction. More specifically, 1 min or longer is preferred.

The surface of the insulating film is then dipped in the solvent adopted above, and it is rinsed by means of an ultrasonic washing machine. This operation is for rinsing off the physically adsorbed organic substance. Consequently, it is preferred that the operation be carried out for at least two rounds, and that each operation use fresh solvent.

The sample is then dipped in ethanol, and just as mentioned previously, rinse is carried out using the ultrasonic washing machine. As a result, a self-assembled molecular monolayer made of the organic substance having a chemical bonding property is formed.

In addition, the surface where the mono-molecular film made of the organic substance having a chemical bonding property has been formed is dipped in a solution. The solution is prepared by dispersing the fine metal grains in it, so that the fine metal grains undergo a reaction with the thiol groups or other groups at the terminal of the molecules that form the self-assembled molecular monolayer. The solvent for dispersing the fine metal grains is preferably a solvent that can easily disperse the fine metal grains. The dispersibility of the fine metal grains depends on the alkane thiols or other coating organic substance coated on the periphery of the fine metal grains.

For example, for the fine metal grains coated with an organic substance having a long molecular chain, such as decane thiol or the like, the following organic solvents with excellent dispersibility are preferred: toluene, acetone, ethyl acetate, cyclohexanone, etc., On the other hand, for the fine metal grains coated with hydroxy decane thiol having hydroxy groups or other polar groups it is preferable to use methanol, ethanol, water or other organic solvents with high polarity, since they have excellent dispersibility.

In addition, as far as the concentration of the fine metal grains in the solution is concerned, if it is too weak, the reaction time becomes too long. On the other hand, if it is too strong, there is an increase in the quantity of the excessively adsorbed multilayer molecules that should be retransferred in the rinse operation. Consequently, the concentration should be determined by balancing these concerns. For example, it is preferred that the concentration of the fine metal grains be in the range of $10^{14}$~$10^{16}$ grains/mL.

The time for dipping the surface with the mono-molecular film made of the organic substance having a chemical bonding property in the solution having the dispersed fine metal grains should be appropriate to ensure a sufficient reaction. More specifically, it is preferred that the dipping time be 1 min or longer.

Subsequently, the surface is then dipped in the solvent used above. This operation is for rinsing off the physically adsorbed organic substance. Consequently, it is preferred that the operation be performed for two or more rounds, and that each operation use fresh solvent.

The sample is then dipped in ethanol, and just as mentioned previously, rinse is carried out using the ultrasonic washing machine. When a surface that has the fine metal grains chemically adsorbed on it is rinsed, the ultrasonic rinse may cleave the formed chemical bonds. In this case, it is preferred that the surface be dipped in the solvent for cleaning and, after holding in this state for 1 min or longer, the sample is transferred to a fresh cleaning liquid and set there for 1 min or longer again.

The solvent is then retransferred and the surface is dried by a nitrogen-gas gun or a spin coater or the like. As a result, a mono-grain layer of the fine metal grains coated with the organic substance is formed. This layer is the charge storage layer 14 on the tunnel insulating film 12.

In the above, according to the present embodiment, it is possible to provide a nonvolatile semiconductor storage device with a wide memory window and a long data holding time. Since it is possible to have a small grain size of the fine metal grains, the characteristics can be improved, so that a nonvolatile semiconductor storage device having a finer structure can be provided.

Embodiment 2

The nonvolatile semiconductor storage device in this embodiment is basically the same as that in Embodiment 1, except that the transistors of the memory cells are n-type transistors using electrons as the carrier. Consequently, the components that are the same as those in Embodiment 1 will not be explained again.

Figure 8:
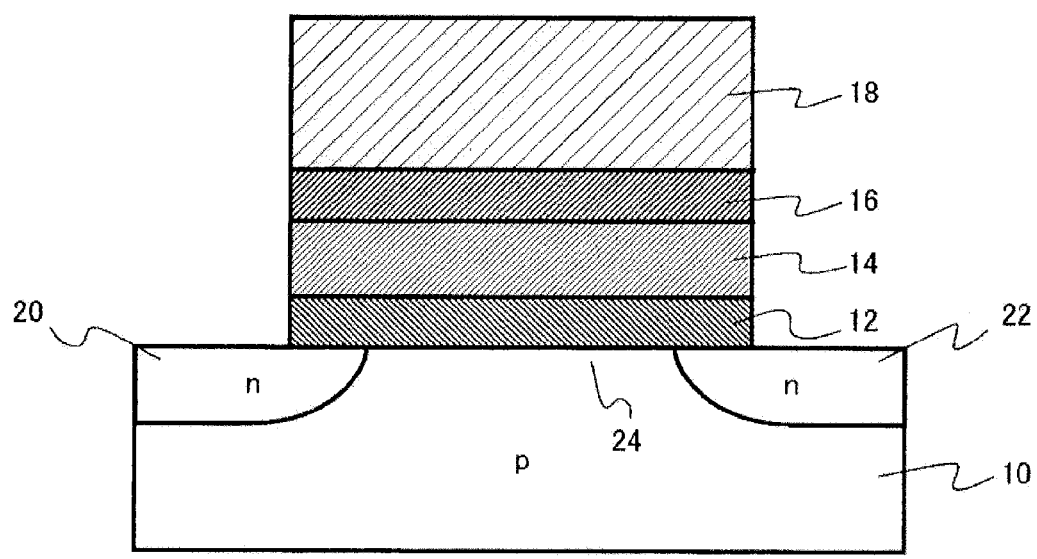
FIG. 8 is a cross-sectional view illustrating the memory cell portion of a nonvolatile semiconductor storage device according to a second embodiment.

FIG. 8 is a cross-sectional view illustrating the memory cell portion of the nonvolatile semiconductor storage device related to the present embodiment.

For example, the memory cell is formed on a p-type semiconductor layer 10 containing a p-type impurity. The memory cell has a tunnel insulating film (first insulating film) 12 on the p-type semiconductor layer 10, a charge storage layer 14 on the tunnel insulating film 12, a block insulating film 16 on the charge storage layer 14, and a gate electrode 18 on the block insulating film 16. In the semiconductor layer 10 and adjacent to its sides, a source region 20 and a drain region 22 are formed, respectively. The region beneath the gate electrode 18 in the semiconductor layer 10 is the channel region 24. Here, the channel region 24 is sandwiched between the source region 20 and the drain region 22.

The source region 20 and the drain region 22 may be formed as n-type diffusion layers containing an n-type impurity. In this way, the memory cell transistors in this embodiment are n-type transistors with electrons as the carrier.

Figure 9:
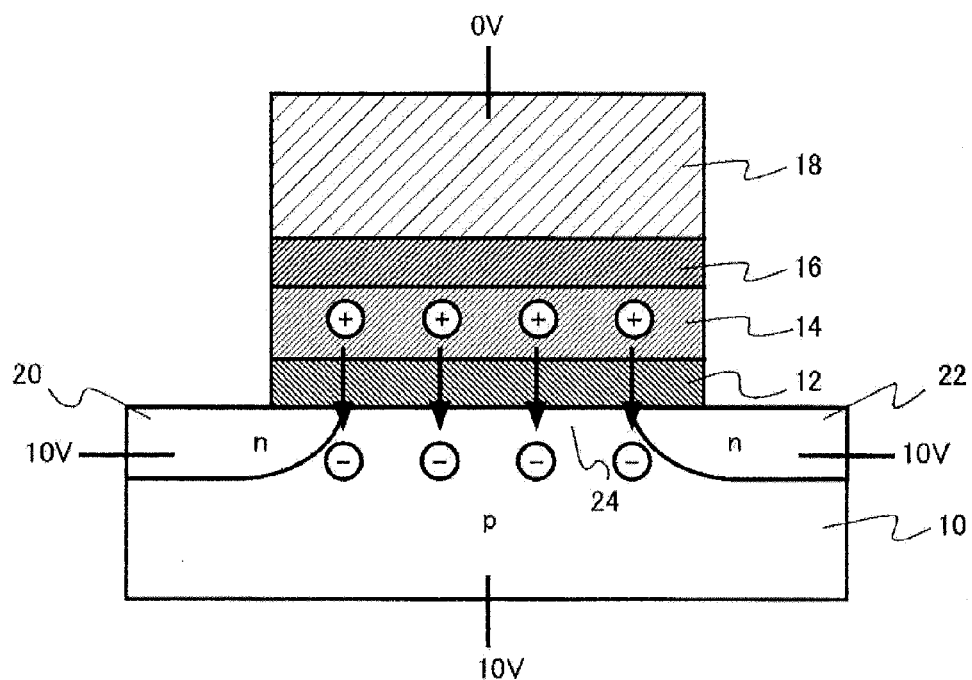
FIG. 9 is a diagram illustrating the write operation of the memory cell in the second embodiment.

In the following, the write, erasure, and read operations of the memory cell will be explained with reference to an example. FIG. 9 is a diagram illustrating the write operation of the memory cell in this embodiment.

In the write operation of the memory cell, a voltage that ensures a relative negative voltage at the gate electrode 18 is applied across the gate electrode 18 and the semiconductor layer 10, and a positive electric charge is stored in the charge storage layer 14. As shown in FIG. 9, for example, the gate electrode 18 is grounded, and a voltage of 10 V is applied on the semiconductor layer 10. Then, for example, a voltage of 10 V is applied on the source region 20 and the drain region 22.

The electrons move from the charge storage layer 14 to the tunnel insulating film 12, and they are extracted to the channel region 24. As a result, the holes are stored in the mono-grain layer of the fine metal grains of the charge storage layer 14.

Figure 10:
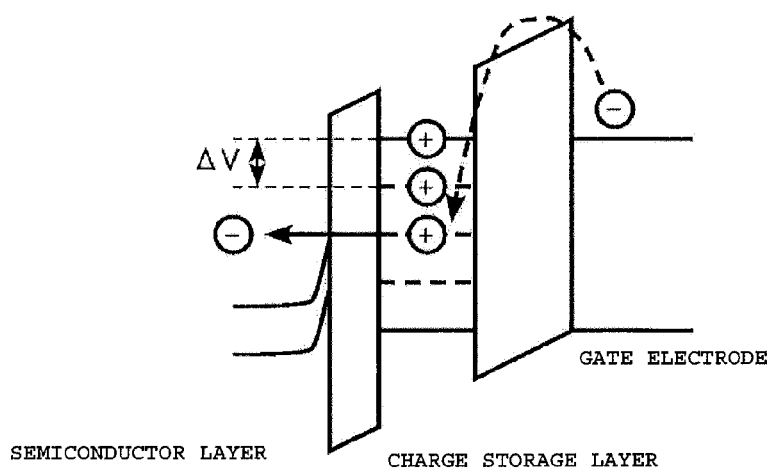
FIG. 10 is a band diagram illustrating the write operation in the second embodiment.

FIG. 10 is a band diagram illustrating the write operation in this embodiment. As the electrons are extracted, when one hole is stored in one fine metal grain, the potential of the fine metal grain falls by $\Delta V$ and, as the second, the third, and other holes are subsequently stored in the fine metal grain, the potential decreases further. Here, a decrease in the potential means that the potential increases on the plus side.

Hence, just as in Embodiment 1, the so-called Coulomb blockade phenomenon takes place. Consequently, when a negative voltage is applied on the gate electrode 18 to store data, the electrons move in the tunnel insulating film 12, so that the number of electrons extracted to the channel region 24 decreases. As a result, the number of the holes stored in the charge storage layer 14 decreases.

However, on the opposite side of the charge storage layer 14, there is a significant decrease in the number of electrons moving from the gate electrode 18 through the block insulating film 16 which are trapped by the fine metal grains, thereby, canceling the stored holes. Consequently, the number of the holes stored in the charge storage layer 14 increases.

Even when the voltage between the gate electrode 18 and the semiconductor layer 10 returns to 0 V, the state of storage of holes is maintained. In this state, the threshold of the memory cell transistor is lower than the threshold when no hole is stored. That is, the state becomes easy for turning on the transistor. This state is the state when data "0" is written.

As the number of holes stored due to the Coulomb blockade phenomenon increases, the difference in threshold from the state in which holes are not stored may become larger. Consequently, the memory window can become wider.

Figure 11:
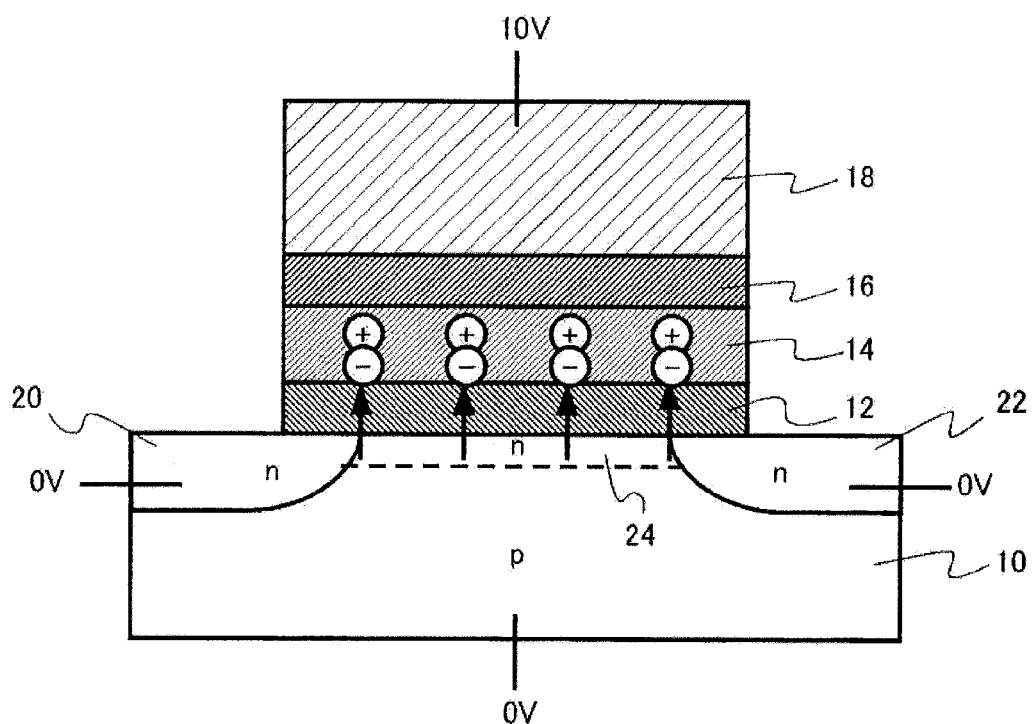
FIG. 11 is a diagram illustrating the erasure operation of the memory cell in the second embodiment.

FIG. 11 is a diagram illustrating the erasure operation of the memory cell in this embodiment. Here, in the erasure operation of data, a voltage that ensures a relative positive voltage at the gate electrode 18 is applied across the gate electrode 18 and the semiconductor layer 10. As shown in FIG. 11, for example, a voltage of 10 V is applied on the gate electrode 18, while semiconductor layer 10 is grounded. For example, ground is applied on the source region 20 and the drain region 22.

Due to the electric field between the gate electrode 18 and the semiconductor layer 10, the electrons move from the inversion layer formed in the channel region 24 to the tunnel insulating film 12, and are injected into the charge storage layer 14. Consequently, the holes stored in the charge storage layer 14 are eliminated.

In the state in which the voltage drop from the gate electrode 18 and the semiconductor layer 10 is reset to 0 V, the stored electric charge is eliminated. Consequently, the threshold of the memory cell transistor becomes higher than that of data "0". That is, the transistor enters a state in which it is hard to be turned on. This state becomes data "1".

Figure 12A:
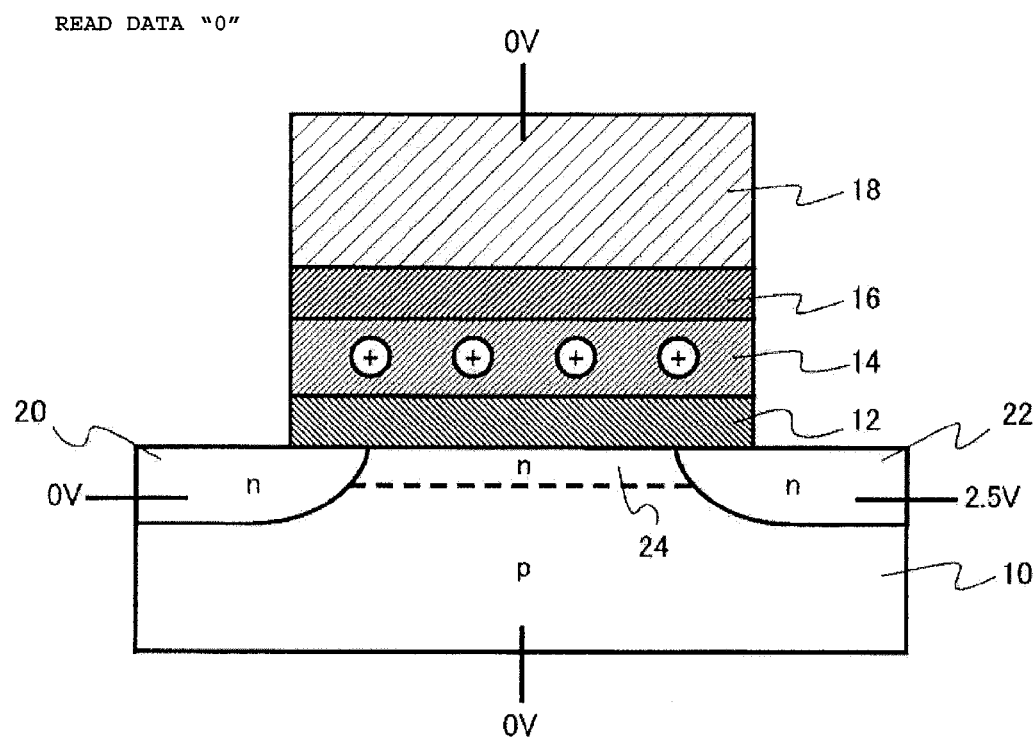
FIGS. 12A and 12B are diagrams illustrating the read operation of the memory cell in the second embodiment.
Figure 12B:
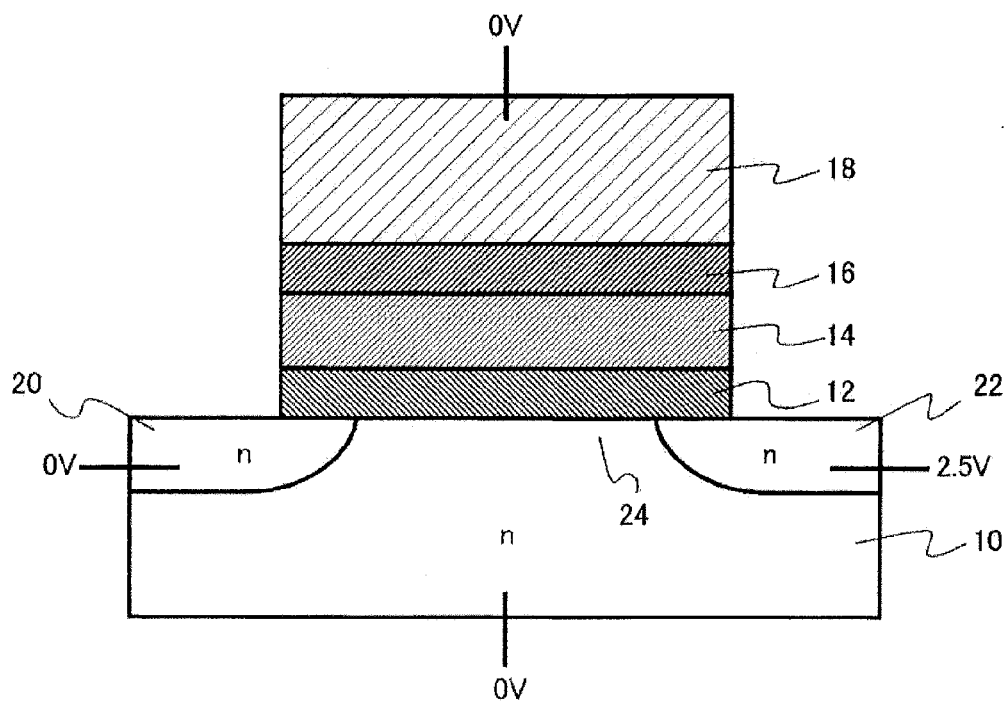

FIGS. 12A and 12B are diagrams illustrating the read operation of the memory cell in this embodiment. FIG. 12A shows the read operation of data "0", and FIG. 12B shows the read operation of data "1". When the data is read, a voltage differential is applied across the source region 20 and the drain region 22.

As shown in FIGS. 12A and 12B, for example, the voltage between the gate electrode 18 and the semiconductor layer 10 is at 0 V. For example, a voltage of 0 V is applied on the source region 20, and a voltage of 2.5 V is applied on the drain region 22. For example, as shown in FIG. 6A, when it is in the state of data "0" with holes stored, the threshold of the transistor becomes low. Consequently, an inversion layer is formed in the channel region 24, and a current flows between the source and the drain.

On the other hand, in the erasure state, that is, in the state of data "1" without the storage of charge, the threshold of the transistor is high, so that no inversion layer is formed in the channel region 24, and no current flows between the source and the drain. Consequently, by detecting the current quantity of the transistor, it is possible to read whether the data is "0" or "1".

Also, after the write operation of the data, in the verify operation of the data for checking whether a write operation has been carried out sufficiently, the same operation as the read operation is executed. When a voltage differential is applied between the source region 20 and the drain region 22, and the desired current does not flow, a data write operation is carried out again.

According to the present embodiment, in the verify operation, a minute voltage is applied between the source and the drain to detect the drain current so that it is possible to check whether the write operation has ended. Here, the minute voltage is greater than the thermal energy ($kT \approx 0.026$, where k is the Boltzmann constant and T represents the temperature), and it is lower than 0.6 V, the maximum value of the diffusion potential difference of the p-n junction of silicon in the conventional case.

As a minute voltage is applied between the source and the drain, it is possible to carry out the verify operation at a high speed and with a low power consumption. The reason is that as the threshold voltage of data is written, a change takes place in the negative voltage direction, so that when an n-type channel with current increasing in the positive voltage direction is used, after data write and while no voltage is applied between the source and drain, the current can flow easily.

Figure 13:
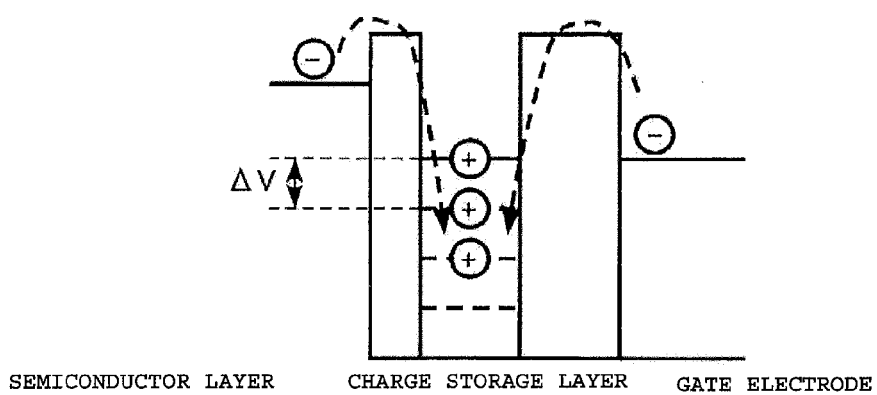
FIG. 13 is a band diagram illustrating the charge storage state of the memory cell in the second embodiment.

FIG. 13 is a band diagram illustrating the charge storage state of the memory cell in this embodiment. In this state, the voltage applied between the gate electrode 18 and the semiconductor layer 10 is 0 V.

As explained above, when the holes are stored in the fine metal grains in the charge storage layer 14, the potential at the fine metal grains falls (becomes larger on the plus side). As a result, when no voltage is applied on the gate electrode 18, there is a decreased quantity of electrons which are extracted from the channel region 24 through the tunnel insulating film 12, and which arrive at the grain layer of the fine metal grains. Also, there is a decreased quantity of electrons that are extracted from the gate electrode 18 through the block insulating film 16 to the grain layer of the fine metal grains.

As the stored holes recombine with the electrons, they cancel each other. However, if the quantity of electrons trapped in the fine metal grains decreases, it becomes easier to maintain the holes stored in the fine metal grains. As a result, the holes stored can be held for a long time. Consequently, the data holding time becomes longer.

According to the nonvolatile semiconductor storage device of the present embodiment, just as in Embodiment 1, the provided nonvolatile semiconductor storage device has a wide memory window and a long data holding time. In addition, it is possible to realize a high speed operation with a low power consumption.

Also, according to the present embodiment, the charge moving in the tunnel insulating film 12 includes electrons instead of holes. Consequently, the reliability of the tunnel insulating film 12 against insulation breakdown can be improved.

Embodiment 3

The nonvolatile semiconductor storage device in this embodiment differs from that of Embodiment 1 in that it is a three-dimensional structure device using the so-called BiCS (Bit-Cost Scalable) technology. The constitution of the portion between the semiconductor layer and the gate electrode and the operation are the same as those in Embodiment 1. Consequently, the contents that are the same as those in Embodiment 1 will not be explained again.

Figure 14:
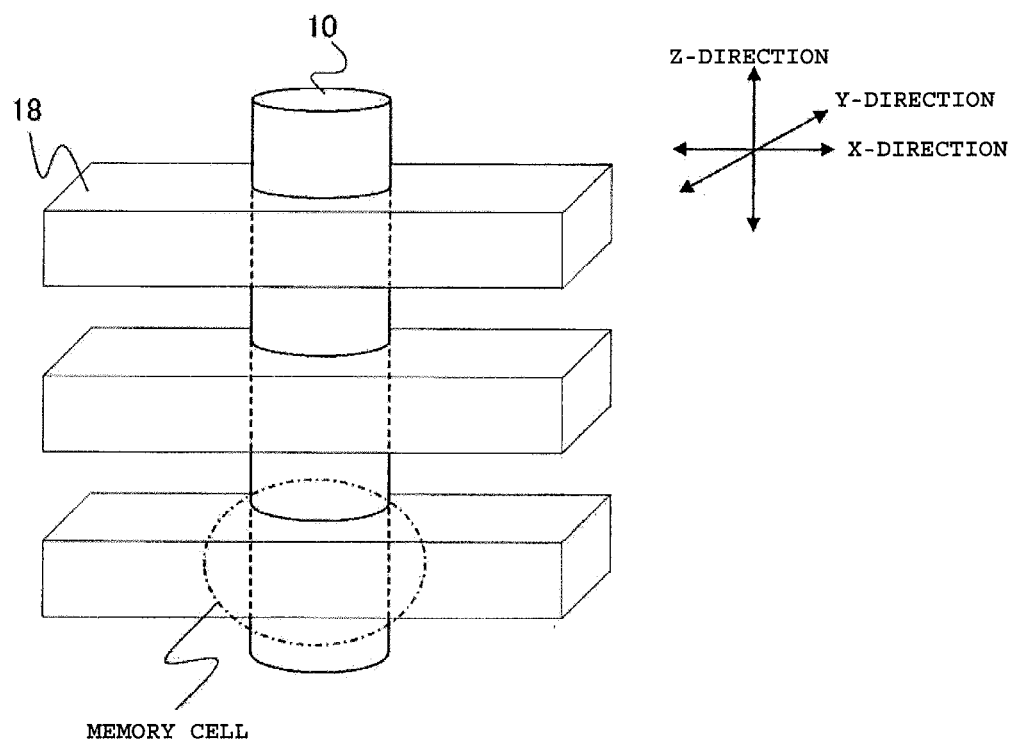
FIG. 14 is a three-dimensional conceptual diagram illustrating a nonvolatile semiconductor storage device according to a third embodiment.
Figure 15:
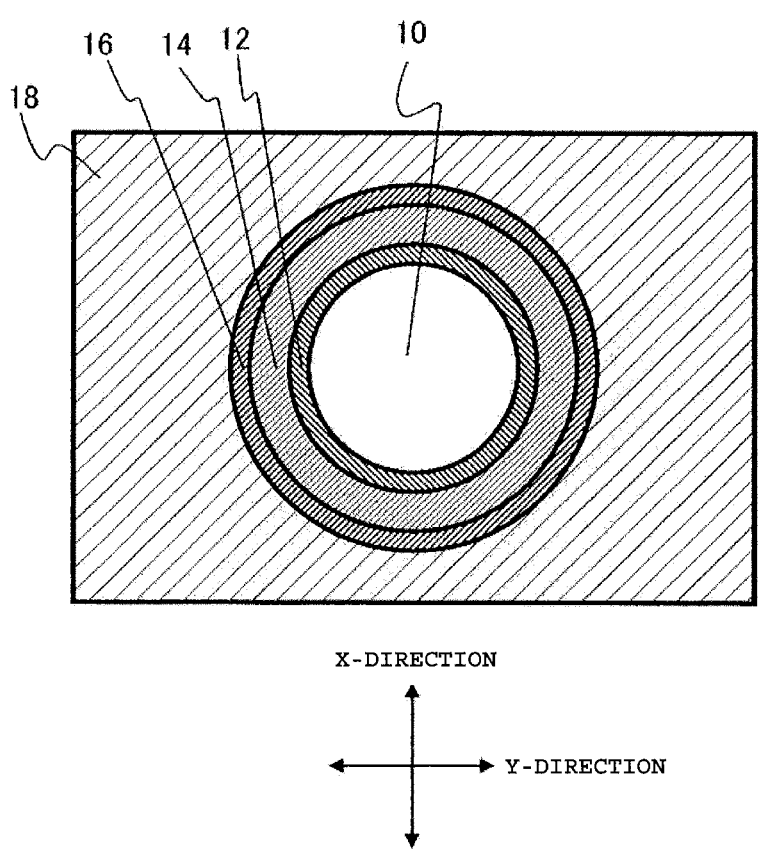
FIG. 15 is an XY cross-sectional view of FIG. 14.
Figure 16:
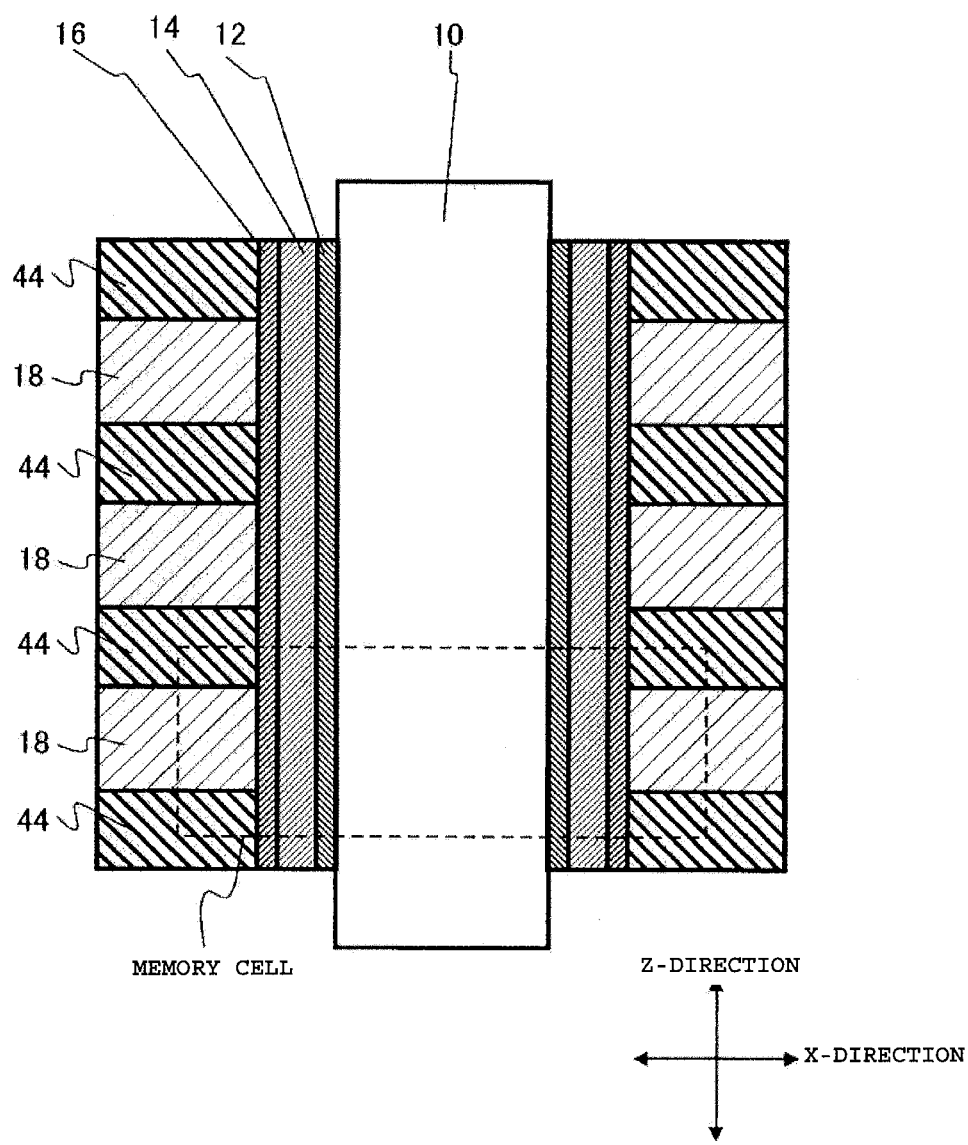
FIG. 16 is an XZ cross-sectional view of FIG. 14.

FIG. 14 is a three-dimensional conceptual diagram illustrating the nonvolatile semiconductor storage device in this embodiment. FIG. 15 is an XY cross-sectional view of FIG. 14. FIG. 16 is an XZ cross-sectional view of FIG. 14.

For the nonvolatile semiconductor storage device of this embodiment, an insulating layer 44 is formed on a substrate not shown in the figure, then gate electrode 18 and insulating layer 44 are laminated alternately to form a multilayer configuration.

In the direction of lamination of the gate electrode 18 and insulating layer 44, a column-shaped semiconductor layer 10 is formed in the direction from the upper surface of the insulating layer 44 towards the substrate. Between the column-shaped semiconductor layer 10 and the gate electrode 18 as well as insulating layer 44, the following films are formed sequentially as counted from the side of semiconductor layer 10: a tunnel insulating film 12 (first insulating film), a charge storage layer 14, and a block insulating film 16 (second insulating film).

In FIGS. 14 and 16, the region defined by a broken line is one memory cell. The structure of the memory cell is composed of the following parts: a tunnel insulating film 12 (first insulating film) on the semiconductor layer 10, a charge storage layer 14 on the tunnel insulating film 12 (first insulating film), a block insulating film 16 (second insulating film) on the charge storage layer 14, and a gate electrode 18 on the block insulating film 16 (second insulating film).

In this embodiment, it is not a necessity to have a small total film thickness of the tunnel insulating film 12, the charge storage layer 14 and the block insulating film 16, combined. Consequently, it is especially preferred that the method for forming the charge storage layer 14 using the self-assembled molecular monolayer explained with reference to Embodiment 1 be adopted.

According to the present embodiment, by forming the memory cell in a three-dimensional configuration, it is possible to increase the integration degree of the memory cells, and it is possible to realize a nonvolatile semiconductor storage device with a storage capacity higher than that of Embodiment 1.

APPLICATION EXAMPLES

In the following, the embodiment will be explained in detail with reference to application examples.

Application Example 1

Using a p-type silicon substrate, a 2-terminal element is manufactured using the following method. A pulse voltage is applied for data write, and the capacitance between the gate and the substrate before and after the application of the pulse voltage are measured. As a result, it is possible to check the charge storage quantity and the charge holding time.

The p-type silicon substrate is loaded in a thermal oxidation oven, and its surface is oxidized to form a silicon oxide film. The film thickness of the silicon oxide is measured and is found to be 3 nm.

Then, in a UV cleaning device, the surface of the formed silicon oxide film is irradiated for 10 min for cleaning. The cleaned substrate is loaded in a dewatered toluene solution with the commercially available 3-(mercapto propyl)triethoxy silane dissolved in it at a concentration of 1 mM, and the catalyst is added until concentration of 3% with respect to the dewatered toluene, followed by setting for 24 h.

The substrate is then taken out and transferred into pure toluene, where rinse is carried out for 1 min while ultrasonic waves are applied on it using an ultrasonic cleaning device. Here, in the rinse operation, a total of two rounds are performed each time with fresh toluene.

After the rinse with toluene, the substrate is transferred into pure toluene, and rinse is carried out while ultrasonic waves are irradiated on it from an ultrasonic cleaning device. The substrate is then promptly transferred into a toluene solution where gold nano grains are dispersed at a concentration of about $10^{14}$ grains/mL. After setting there for 24 h, the gold nano grains are chemically adsorbed. As a result, the obtained gold nano grains having a grain size of 2 nm and having their periphery coated with decane thiol are used.

The substrate is then transferred to pure toluene, and rinse is carried out in two rounds while ultrasonic waves are irradiated on it using an ultrasonic cleaning device. The substrate is then transferred into pure ethanol and rinse is carried out for 1 min while ultrasonic waves are irradiated on it using an ultrasonic cleaning device. Then, it is dried by a nitrogen-gas duster.

The substrate is then loaded in a thermal type ALD device, and a hafnium oxide film is formed at 150° C. on the surface where the gold nano grains are chemically adsorbed. The result of the film thickness measurement indicated that the film thickness is 10 nm.

The back surface of the substrate is then dipped in a concentrated aqueous solution of hydrofluoric acid to remove the excessive oxide film formed on the back surface. After rinse with pure water, aluminum is vapor deposited on the back surface to form an electrode on the substrate side. Also, on the upper surface of hafnium oxide of the substrate, gold is vapor deposited via a mask made of a metal and with holes formed on it to form a gate electrode. Finally, the sample is loaded in an RTA device for annealing in a $N_2$ gas atmosphere containing 3% of $H_2$ at 300° C. for 30 min. As a result, a 2-terminal element is formed.

Application Example 2

A 2-terminal element is manufactured in the same way as in Application Example 1, except that instead of the gold nano grains with a grain size of 2 nm used in Application Example 1, 3-nm gold nano grains are used.

Application Example 3

A 2-terminal element is manufactured in the same way as in Application Example 1, except that the film thickness of the silicon oxide film as the tunnel insulating film is increased from the 3 nm in Application Example 1 to 5 nm.

Application Example 4

A 2-terminal element is manufactured in the same way as in Application Example 1, except that the film thickness of the silicon oxide film as the tunnel insulating film is increased from 3 nm to 5 nm and, instead of the gold nano grains with a grain size of 2 nm, 3-nm gold nano grains are used.

Comparative Example 1

A 2-terminal element is manufactured in the same way as in Application Example 1, except that instead of the p-type silicon substrate used in Application Example 1, an n-type silicon substrate is used.

Comparative Example 2

A 2-terminal element is manufactured in the same way as in Application Example 1, except that instead of the p-type silicon substrate used in Application Example 1, an n-type silicon substrate is used, and that instead of the gold nano grains with a grain size of 2 nm, the 3-nm gold nano grains are used.

For each of the elements manufactured in Application Examples 1, 2, 3, 4 and Comparative Examples 1, 2, the following measurement is carried out. The aluminum electrode on the back surface of the element is brought in contact with the stage of the measurement device, and the terminal is attached, and the gold electrode on the upper surface is brought in contact with a measurement needle, and the terminal is attached. While the voltage is changed, the capacitance is measured. The pulse voltage is then applied to perform a data write operation. Then, as the voltage is changed, the capacitance is measured again. As a result, the charge quantity stored in the gold nano grains is measured.

Figure 17:
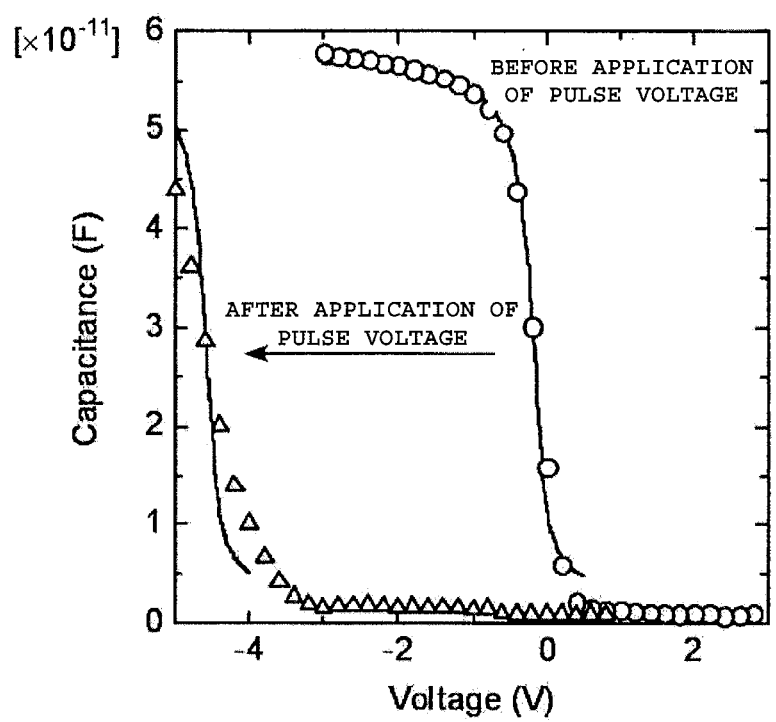
FIG. 17 is a diagram illustrating the result of measurement of the capacitance in a first example.

FIG. 17 is a diagram illustrating the results of the measurement of the capacitance in Application Example 1. For the element obtained in Application Example 1, the capacitance is measured. A pulse voltage of −12 V is applied for an application duration of 100 ms on the gold gate electrode on the upper surface, and the capacitance is measured again. The results are presented.

As the saturated region of the capacitance is observed, one can conclude that when the saturated region changes, the threshold voltage changes in the minus direction. The voltage shift indicates that due to the pulse voltage applied from the gold gate electrode, the positive electric charge moves from the p-type silicon substrate to the gold nano grains, and the positive electric charge is stored in the gold nano grains.

By multiplying the value of the voltage shift by the value of the capacitance of the block insulating film determined from the maximum value of the capacitance and the value of the capacitance of the silicon oxide, the density of the charge stored in the gold nano grains is determined. In addition, the capacitance of silicon oxide is determined with the specific dielectric constant of silicon oxide fixed at 3.9.

Figure 18:
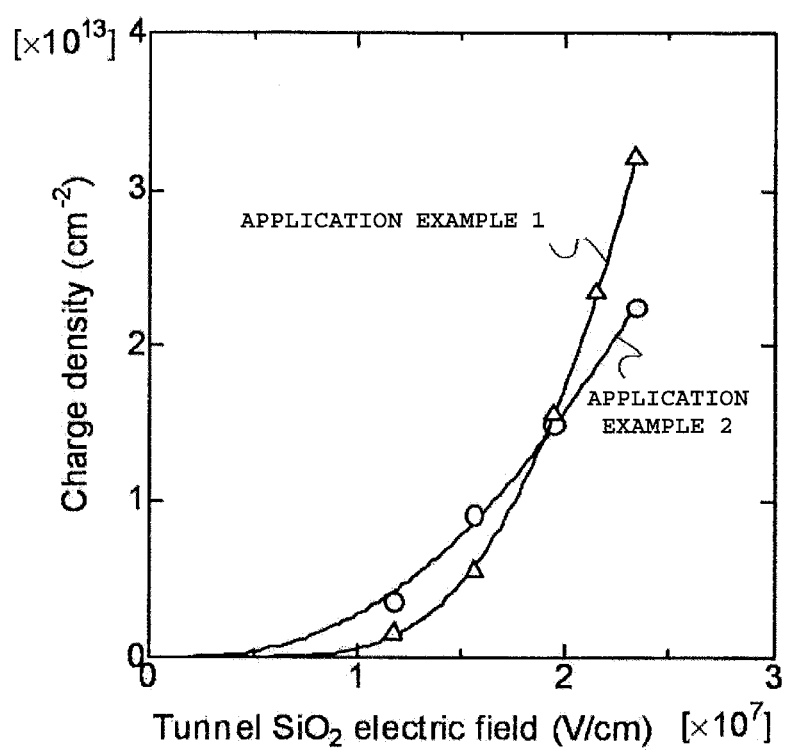
FIG. 18 is a diagram illustrating the dependence of the stored electric charge density on the applied electric field in first and second examples.

FIG. 18 is a diagram illustrating the dependence of the stored electric charge density on the applied electric field in Application Examples 1 and 2. For the elements prepared in Application Examples 1 and 2, at the application time of 100 ms, while the voltage is changed, a pulse voltage is applied on the gold gate electrode and with the same method, the shift quantity of the threshold voltage of the capacitance before and after application of the pulse voltage is measured. It is multiplied by the value of the capacitance of the block insulating film to determine the stored electric charge density, which is taken as the ordinate in the diagram. On the other hand, the computed value of the electric intensity applied on the silicon oxide by applying the pulse voltage is taken as the abscissa.

From FIG. 18, it can be seen that the element prepared in Application Example 1 can store more charge in the high electric field region than the element prepared in Application Example 2.

Compared with Application Example 2, in Application Example 1, the grain size of the gold nano grains as the fine metal grain is smaller, so that the phenomenon of a fall in the potential of the gold nano grains generated when a positive electric charge enters the gold nano grains becomes significant. Consequently, while the positive electric charge can hardly be trapped by the gold nano grains in the low electric field region, the negative electric charge moving from the gold gate electrode opposite to that of the p-type silicon substrate that becomes the channel in the high electric field region can hardly be trapped by the gold nano grains. Thus, as a result, it is indicated that the charge amount stored on the gold nano grains.

The holding time of the stored electric charge is then measured. As shown in FIG. 17, for the value of the threshold voltage of the capacitance that shifts as the pulse voltage is applied, after setting for a prescribed time, the capacitance is measured again, and the degree of attenuation is checked and evaluated.

Figure 19:
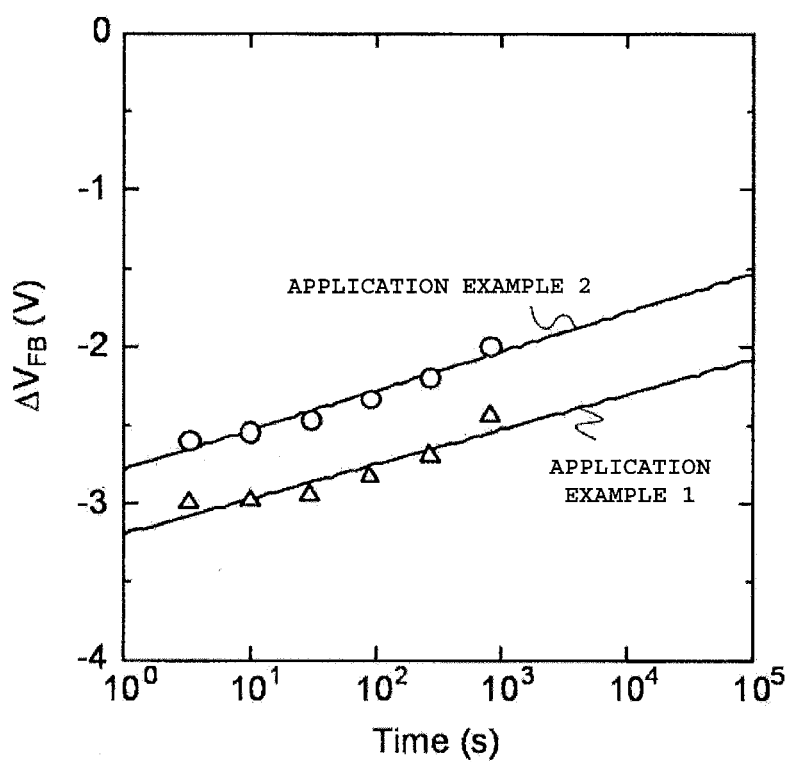
FIG. 19 is a diagram illustrating the charge holding characteristics in first and second examples.

FIG. 19 is a diagram illustrating the charge holding characteristics in Application Examples 1 and 2. In Application Examples 1 and 2, by applying a pulse voltage of −10 V and 100 ms on the gold gate electrode, the threshold voltage ($V_{FB}$) of the capacitance is shifted. After a prescribed time, the capacitance is measured again, and the threshold voltage of the capacitance is checked. The threshold voltage that varies with respect to the lapsed time is then plotted to form a graph. With respect to the plotted dots, an approximate line is drawn on the logarithmic scale, and the time until an attenuation of 5% with respect to the initial voltage shift value measured immediately after application of the pulse voltage is checked.

In Application Example 1, the result is 5.19 s and in Application Example 2, the result is 3.59 s. It can be seen that the charge holding time for the stored electric charge in Application Example 1 is longer than that in Application Example 2. Compared with Application Example 2, in Application Example 1, the grain size of the fine metal grains is smaller, so that the phenomenon of a decrease in the potential of the gold nano grains that takes place when a positive electric charge enters the gold nano grains is significant. Consequently, it is difficult for the stored positive electric charge to escape to the p-type silicon side and the gate electrode side. Also, it is difficult for the negative electric charge, which could move from the gold gate electrode opposite to the p-type silicon substrate to cancel the stored positive electric charge, to be trapped by the gold nano grains, and thus the stored electric charge can be stored for a long time.

Figure 20:
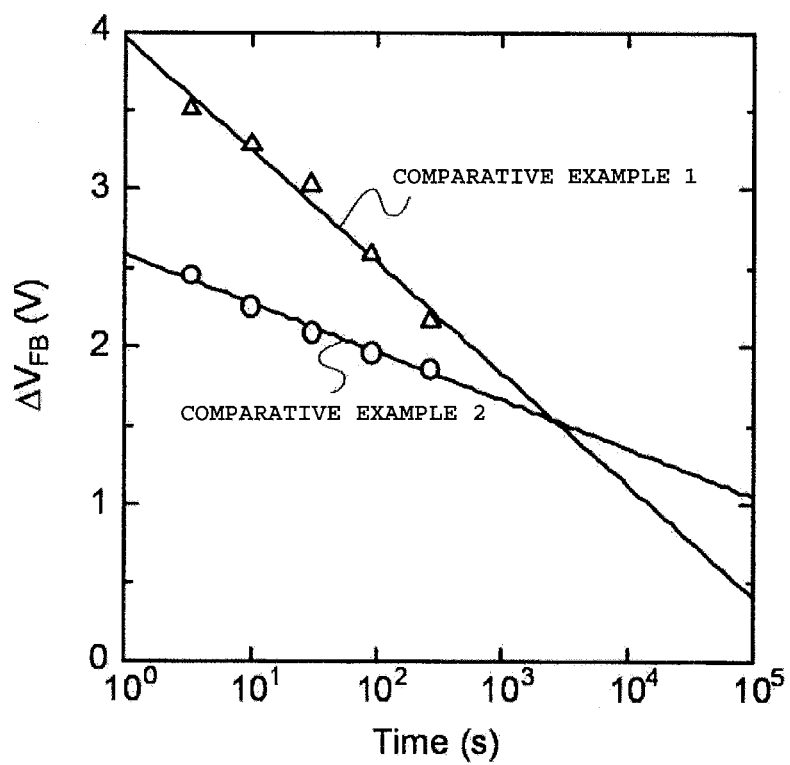
FIG. 20 is a diagram illustrating the charge holding characteristics of first and second comparative examples.

In addition, with the same method, the holding time of the stored electric charge is measured in Comparative Examples 1 and 2. FIG. 20 is a diagram illustrating the charge holding characteristics in Comparative Examples 1 and 2. It shows the graph of the value of the threshold voltage shift of the capacitance after the application of the pulse voltage with respect to the lapsed time in Comparative Examples 1 and 2.

Just as in Application Examples 1 and 2, the time when attenuation is 5% with respect to the initial voltage shifted value immediately after application of pulse voltage is checked. It is found that the value is 1.90 s in Comparative Example 1, and it is 2.63 s in Comparative Example 2. It can be seen that the holding time of the stored electric charge in Comparative Example 1 is shorter than that in Comparative Example 2.

Different from Application Examples 1 and 2, in Comparative Examples 1 and 2, when the grain size of the gold nano grains as the fine metal grains is smaller, the phenomenon of a rise in the potential of the gold nano grains that takes place when the negative electric charge enters the gold nano grains becomes more significant. Consequently, the stored negative electric charge can easily escape to the n-type silicon side or the gate electrode side. Also, the positive electric charge with the effect of canceling the negative electric charge moving from the gold gate electrode opposite to the n-type silicon substrate and stored can be easily trapped by the gold nano grains, and the stored electric charge becomes shorter. Consequently, compared with Comparative Example 2, in Comparative Example 1 with a smaller grain size of the gold nano grains, it is believed that that the holding time of the stored electric charge is shorter.

From the results, for the nonvolatile semiconductor storage device using the fine metal grains as shown in the embodiment, it is necessary to have a structure in which a negative voltage is applied on the gate electrode to store the positive electric charge in the fine metal grains, and it is preferred that the grain size of the fine metal grains be smaller, especially 2 nm or smaller.

Figure 21:
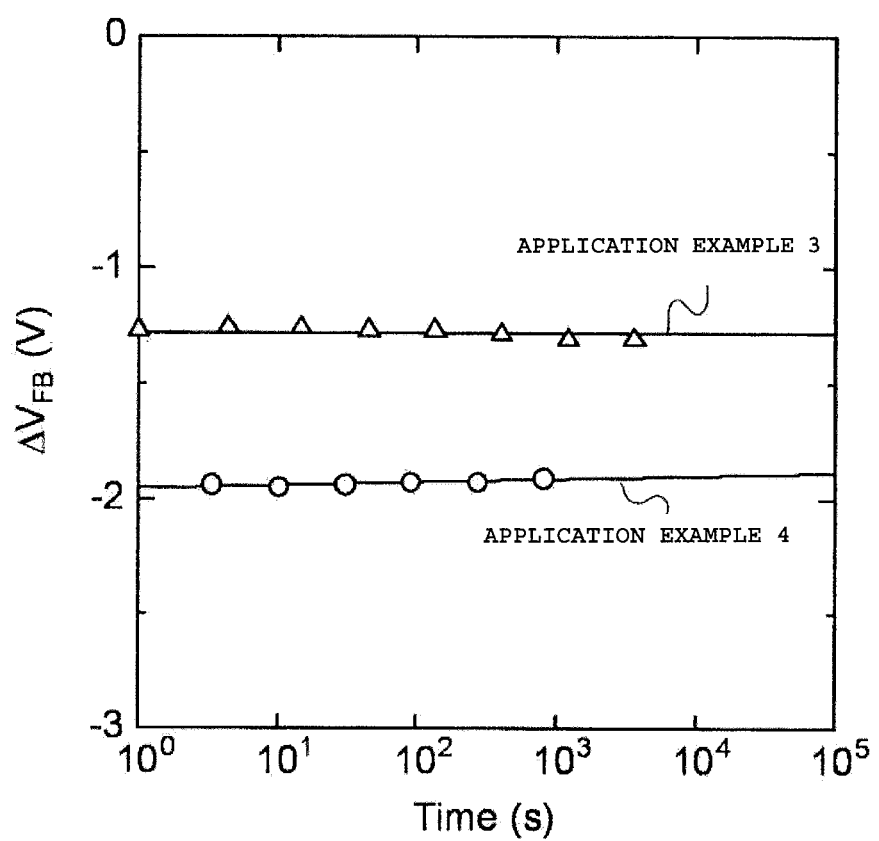
FIG. 21 is a diagram illustrating the charge holding characteristics of third and fourth examples.

Similarly, the holding characteristics of the stored electric charge in Application Examples 3 and 4 are measured. FIG. 21 is a diagram illustrating the electric charge holding characteristics of Application Examples 3 and 4. It is a graph plotted for the value of the threshold voltage shift of the capacitance after the application of the pulse voltage versus the lapsed time in Application Examples 3 and 4.

In Application Examples 3 and 4, the time at which attenuation is 5% with respect to the initial voltage shifted value measured immediately the after application of the pulse voltage is checked, and little change is observed. It has been found that the time is 10 years or longer in Application Example 3, and it is about 1 year in Application Example 4. As explained above, it is preferred that the film thickness of the tunnel film be 5 nm or thicker.

As explained above, the nonvolatile semiconductor storage device related to the embodiment has a high stored charge density, so that it has more data stored, and a longer data holding time. Consequently, it has a very high industrial value.

In the above, the embodiments have been explained. However, the embodiments are merely examples, and the present disclosure is not limited to the embodiments. In the explanation of the embodiments, for the nonvolatile semiconductor storage device and the manufacturing method of the nonvolatile semiconductor storage device, the portions not directly related to the explanation of the present disclosure have been omitted. However, as needed, the composing requirements related to the nonvolatile semiconductor storage device and the manufacturing method of the nonvolatile semiconductor storage device can be appropriately selected and used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
an n-type semiconductor layer;
a first insulating film formed on the semiconductor layer;
a charge storage layer formed on the first insulating film and having metal grains that are coated with a first organic substance;
a second insulating film formed on the charge storage layer;
a gate electrode formed on the second insulating film;
a molecular layer formed between the first insulating film and the charge storage layer, the molecular layer including a second organic substance different from the first organic substance; and
a p-type source region and a p-type drain region formed in the semiconductor layer on a first side and a second side of the gate electrode, respectively.

2. The nonvolatile semiconductor storage device according to claim 1, wherein a positive electric charge stored in the charge storage layer indicates a data written state.

3. The nonvolatile semiconductor storage device according to claim 1, wherein the metal grains are metal nano grains.

4. The nonvolatile semiconductor storage device according to claim 3, wherein the metal grains are gold nano grains.

5. The nonvolatile semiconductor storage device according to claim 4, wherein the grain size of the gold nano grains ranges from 0.5 nm to 2 nm.

6. The nonvolatile semiconductor storage device according to claim 1, wherein, when an erase voltage is applied across the gate electrode and the semiconductor layer to set the gate electrode at a higher voltage relative to the semiconductor layer, an amount of positive electric charge stored in the charge storage layer is reduced.

7. The nonvolatile semiconductor storage device according to claim 1, wherein, when a read voltage is applied across the source region and the drain region, a current flow between the source region and drain region following application of the read voltage is sensed to determine a written state.

8. The nonvolatile semiconductor storage device according to claim 7, wherein the current flow that is greater than a threshold indicates the written state.

9. The nonvolatile semiconductor storage device according to claim 7, wherein the current flow that is less than a threshold indicates a non-written state.

10. The nonvolatile semiconductor storage device according to claim 1, wherein, when a verify voltage is applied across the source region and the drain region and a current flow between the source region and the drain region is below a threshold, the write voltage is applied to the gate electrode again.

11. The nonvolatile semiconductor storage device according to claim 1,
wherein the film thickness of the first insulating film is in the range of 5 nm to 7 nm, and the film thickness of the second insulating film is in the range of 5 nm to 10 nm.

12. The nonvolatile semiconductor storage device according to claim 1, wherein the metal grains are made of at least one of Au, Ag, Cu, Pt, Pd, W, Ru, Co, and Ni.

13. The nonvolatile semiconductor storage device according to claim 1, wherein the first organic substance is an alkane thiol.

14. The nonvolatile semiconductor storage device according to claim 1, wherein, when a write voltage is applied across the gate electrode and the semiconductor layer to cause the gate electrode to be at a negative voltage relative to the semiconductor layer, a positive electric charge is stored in the charge storage layer.

15. The nonvolatile semiconductor storage device according to claim 1, wherein the molecular layer is a self-assembled molecular monolayer.

16. The nonvolatile semiconductor storage device according to claim 1, wherein the second organic substance includes a hydrocarbon compound having a thiol group at a first end and a silanol group at a second end.

17. The nonvolatile semiconductor storage device according to claim 1, wherein the second organic substance includes a molecule represented by following formula, wherein $R_3$ is one of $OCH_3$, $OC_2H_5$, $OC_3H_5$, Cl, Br, or F and each $R_3$ is either same or different as each other $R_3$, and n is an integer in a range of 1 to 20:

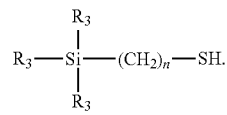

18. A nonvolatile semiconductor storage device comprising:
- a semiconductor layer of a first conductivity type;
- a first insulating film formed on the semiconductor layer;
- a charge storage layer formed on the first insulating film and having metal grains that are coated with a first organic substance;
- a second insulating film formed on the charge storage layer;
- a gate electrode formed on the second insulating film;
- a molecular layer formed between the first insulating film and the charge storage layer, the molecular layer including a second organic substance different from the first organic substance; and
- a source region of a second conductivity type and a drain region of the second conductivity type, the source region and the drain region being formed in the semiconductor layer on a first side and a second side of the gate electrode, respectively.

* * * * *